United States Patent [19]

Fong et al.

[11] Patent Number: 4,898,767

[45] Date of Patent: Feb. 6, 1990

[54] COPPER-EXUDING BOROALUMINOSILICATE GLASSES

[75] Inventors: Gerald D. Fong, Beaver Dams; Sheryl L. Hultman, Corning, both of N.Y.

[73] Assignee: Corning Incorporated, Corning, N.Y.

[21] Appl. No.: 212,478

[22] Filed: Jun. 28, 1988

Related U.S. Application Data

[62] Division of Ser. No. 105,262, Oct. 7, 1987.

[51] Int. Cl.$^4$ .............................................. H05K 1/03
[52] U.S. Cl. ................................... 428/210; 428/432; 428/698; 428/901
[58] Field of Search ............... 428/432, 698, 699, 901, 428/209, 210

[56] References Cited

U.S. PATENT DOCUMENTS

| | | | |
|---|---|---|---|
| 4,672,152 | 6/1987 | Shinohara et al. | 428/901 X |
| 4,732,798 | 3/1988 | Ishida et al. | 428/901 X |
| 4,752,521 | 6/1988 | Smith III et al. | 428/432 X |

*Primary Examiner*—Nancy A. B. Swisher
*Attorney, Agent, or Firm*—CLinton S. Janes, Jr.; Milton M. Peterson

[57] ABSTRACT

There is disclosed a family of low dielectric, copper-exuding, boroaluminosilicate glasses particularly adapted to use in forming substrates for electronic devices such as integrated circuits. The glasses are capable of exuding copper oxide, have a coefficient of thermal expansion of $30-35 \times 10^{-7}$ at 300° C., a dielectric constant not over 5.0 at 100 KHz, a loss tangent not over 0.003 at 100 KHz and consist essentially, in percent by weight, of 56–64% $SiO_2$ 18–25% $B_2O_3$, 3–11% $Al_2O_3$, 0–2% CaO, 0–2% $Li_2O$, 0–1% $K_2O$, the $Li_2O+K_2O+CaO$ being 1.5–3% and 1–20% CuO.

4 Claims, No Drawings

COPPER-EXUDING BOROALUMINOSILICATE GLASSES

RELATED APPLICATION

This is a division of application Ser. No. 105,262, filed Oct. 7, 1987.

An application, filed of even date herewith in the names of E. A. Boylan and G. D. Fong, and entitled "Thermal Writing on Glass and Glass-Ceramic Substrates", discloses and claims a method of producing a pattern of a transition metal on a glass or glass-ceramic substrate by applying an intense, well-focused source of energy along a path on the substrate that corresponds to the pattern, the glass being one that contains a substantial amount of the oxide of the transition metal, and that is capable of exuding the metal under thermal influence. It further discloses and claims the article produced which may, for example, be microcircuitry. A preferred source of energy is a laser beam with the glass being capable of absorbing the optical energy and converting it to thermal energy.

INTRODUCTION

This invention is concerned with low dielectric, boroaluminosilicate glasses that exude copper oxide upon heat treatment. It is particularly concerned with such glasses that have coefficients of thermal expansion that permit serving as a substrate for silicon chips in integrated circuits.

It is known that silicon has a coefficient of thermal expansion about $32 \times 10^{-7}$ at 300° C. Accordingly, glasses compatible with silicon should have coefficients of about 30-35. In addition, the glasses must have special characteristics to be advantageously used in production of high frequency circuits. These characteristics include a dielectric constant not over 5.0 and loss tangents not over 0.003 as measured in frequency domains of interest. Finally, it would be desirable to provide electroconductive metal patterns on selected portions of the glass surface to serve as contacts, interconnections and the like.

PURPOSES OF THE INVENTION

A basic purpose is to provide a family of copper-containing, low dielectric, boroaluminosilicate glasses capable of exuding copper when thermally excited.

Another purpose is to provide such glasses having coefficients of thermal expansion in the range of 30-35 $\times 10^{-7}$ at 300° C.

A further purpose is to provide such glasses having a dielectric constant not over 5.0 and loss tangents not over 0.003 at 100 kilohertz (KHz).

A still further purpose is to provide an integrated circuit comprising a silicon element and a substrate formed from a low dielectric, boroaluminosilicate glass capable of exuding copper under thermal excitement.

Still another purpose is to produce electronic devices having leads interconnected by very fine, electroconductive, metal lines.

A further purpose is to produce a metal pattern on a glass or glass-ceramic surface by a simple thermal treatment.

Another purpose is to produce metal circuit lines less than 2 mils (50 microns) in width.

SUMMARY OF THE INVENTION

One aspect of our invention is a family of low dielectric, copper-exuding, boroaluminosilicate glasses consisting essentially of, in percent by weight on the oxide basis 56-64% $SiO_2$, 18-25% $B_2O_3$, 3-11% $Al_2O_3$, 0-2% CaO, 0-2% $Li_2O$, 0-1% $K_2O$, total $Li_2O + K_2O + CaO$ is 1.5-3%, and 1-20% CuO, and having a coefficient of thermal expansion of $30-35 \times 10^{-7}$ at 300° C., a dielectric constant not over 5.0 at 100 KHz, and a loss tangent not over 0.003 at 100 KHz.

In another form, the invention is an electronic device comprising a silicon element and a substrate for the element formed from a low dielectric, copper-exuding, boroaluminosilicate glass consisting essentially of, in percent by weight on the oxide basis, 56-64% $SiO_2$, 18-25% $B_2O_3$, 3-11% $Al_2O_3$, 0-2% CaO, 0-2% $Li_2O$, 0-1% $K_2O$, total $Li_2O + K_2O + CaO$ is 1.5-3%, and 1-20% CuO, and having a coefficient of thermal expansion of $30-35 \times 10^{-7}$ at 300° C., a dielectric constant not over 5.0 at 100 KHz, and a loss tangent not over 0.003 at 100 KHz.

PRIOR LITERATURE

U.S. Pat. No. 3,420,645 (Hair) discloses a method of making a hollow glass article having a metallic copper coating. Solid particles of a $CuO-Al_2O_3-SiO_2$ glass are heated in a hydrogen-containing atmosphere to expand the particles and cause metallic copper to form on their surfaces.

U.S. Pat. No. 3,464,806 (Seki et al.) and British Patent No. 944,571 (McMillan et al.) describe producing a copper or silver metallized glass-ceramic by including a nucleating agent and copper or silver oxide in a cerammable glass, and heating the glass on a controlled cycle in a reducing atmosphere.

U.S. Pat. No. 3,490,887 (Herczog et al.) discloses outward migration of copper ions in a ferroelectric glass-ceramic by controlled heat treatment. The copper ions oxidize at the surface to form an oxide layer that can be reduced to metallic copper by firing in hydrogen.

U.S. Pat. No. 3,528,829 (Baak et al.) discloses glasses in the $Cu_2O-Al_2O_3-SiO_2$ system having coefficients of thermal expansion about $10 \times 10^{31\ 7}$.

Kamiya et al., *Journal of Non-Crystalline Solids*, 80 (1986) 405-411, describe studies on the behavior of copper ions in $CuO-Al_2O_3-SiO_2$ glasses heated in air.

GENERAL DESCRIPTION

The invention arose from a search for low dielectric glasses that are capable of exuding copper on a surface when heat treated. The dielectric requirements are a dielectric constant not over 5.0 when measured at 100 KHz, and a loss tangent not over 0.003 when measured at 100 KHz.

It is recognized that measurement of dielectric properties may be specified at much higher frequency values for some applications. However, it has proven convenient to make measurements at 100 KHz. Furthermore, such measurements are deemed adequate, since literature reports indicate that both dielectric constant and loss tangent decrease to minimum values as the frequency of measurement is increased.

The search was further limited by the need for a glass coefficient of thermal expansion between about 30 and $35 \times 10^{-7}$ at 300° C. This was necessary to permit forming a seal with silicon in an electronic device, specifically an integrated circuit.

It was recognized that at least some borosilicates and aluminosilicates were known to be capable of exuding copper oxide under influence of heat. Likewise, both types of glass tend to have low coefficients of thermal expansion. However, glasses otherwise statisfactory generally failed to provide dielectric properties within limits. For example, one series of borosilicates containing small amounts of alumina had dielectric constants between 5.0 and 6.0 and loss tangents ranging from 0.004 to 0.014.

A known low dielectric borosilicate is composed of 70.0% $SiO_2$, 28.2% $B_2O_3$, 1.2% $Li_2O$ and 0.6% $K_2O$. The addition of CuO, in amounts up to 10% by weight, to this composition, had little effect on the low dielectric characteristics. However, the glasses failed to exude copper oxide when heat treated.

Further studies revealed that a content of at least three (3) weight percent of alumina was required to render the glasses capable of exuding copper. However, in the absence of lithia ($Li_2O$), it has been found necessary to employ at least five (5) weight percent alumina to permit copper exudation. Alumina tends to raise the dielectric values and harden the glass. Accordingly, the alumina content should not exceed about 11% by weight.

As just observed, the presence of lithia is desirable to facilitate copper exudation. However, increasing amounts of lithia tend to increase the dielectric constant, thus restricting the lithia content to not over about four mole percent (about two wt. %).

CaO may replace $K_2O$ and partially replace the $Li^2O$ in a glass. It tends to increase the dielectric constant and decrease the expansion coefficient. Therefore, if present, this oxide must be restricted.

At least about one wt. % copper oxide is required for exudation and up to about 20% may be permissible. However, for some purposes, it is desirable to limit the content of copper oxide to not over ten weight percent, since larger amounts tend to increase the dielectric constant.

SPECIFIC DESCRIPTION

TABLE I sets forth compositions for several exemplary glasses within the scope of our invention. These compositions are calculated on the oxide basis from the glass batch, and are given in parts by weight. Since the total approximates 100 in each case, the compositions may be taken as if in percent by weight.

The table further sets forth a number of property measurements made on glasses having the indicated compositions. The dielectric constant (K) was measured at 100 KHz; the loss tangent (LT) at 2.5 GHz for Examples 1–4, and at 100 KHz for Examples 5 and 6; the coefficient of thermal expansion ($CTE \times 10^{-7}$) at 300° C. The surface resistance of thermally exuded copper, as measured on each Example, was uniformly low (less than 5 ohm-cm).

TABLE I

|  | 1 | 2 | 3 | 4 | 5 | 6 |
|---|---|---|---|---|---|---|
| $SiO_2$ | 63.7 | 62.8 | 60.8 | 59.7 | 62.6 | 60.6 |
| $B_2O_3$ | 22.8 | 20.6 | 19.8 | 18.1 | 20.6 | 19.9 |
| $Al_2O_3$ | 5.0 | 8.2 | 8.1 | 11.1 | 8.2 | 7.9 |
| $Li_2O$ | 1.1 | 1.1 | 1.1 | 1.1 | 0.8 | 1.1 |
| CuO | 6.8 | 6.7 | 9.7 | 9.5 | 6.7 | 6.5 |
| $K_2O$ | 0.6 | 0.6 | 0.6 | 0.5 | 0.6 | 0.6 |
| CaO | — | — | — | — | 0.5 | — |

TABLE I-continued

|  | 1 | 2 | 3 | 4 | 5 | 6 |
|---|---|---|---|---|---|---|
| $Fe_2O_3$ | — | — | — | — | — | 3.5 |
| K | 4.47 | 4.63 | 4.75 | 4.87 | 4.90 | 4.48 |
| LT | 0.0015 | 0.0020 | 0.0020 | 0.0020 | 0.0010 | 0.0020 |
| C.T.E. | 32.8 | 34.5 | 34.8 | 30.5 | 31.3 | — |

Glass batches corresponding to each of the compositions in TABLE I were mixed, melted and poured into molds, or rolled into ⅛"(3 mm) patties, for measurement of properties. The batches were melted in silica crucibles for six hours at 1600° C. Standard commercial raw materials were employed.

The glass test pieces were fired in air for six hours at 550° C., then examined for exudation of copper oxide as a dull gray surface coating. If none was observed, a sample was successively fired at 50° C. intervals up to 750° C. If exudation had not occurred by 750° C., the glass was rejected, since higher temperatures would tend to soften and distort the glass.

If a sample did exude copper oxide, it was then heated in a hydrogen atmosphere for 2 to 4 hours at 320° C., after first purging the furnace with nitrogen. The samples were cooled to 100° C. in hydrogen, and then exposed to nitrogen for cooling to ambient and purging of the hydrogen.

Discs two inches in diameter were then ground and polished, and painted with a silver paint for dielectric measurements.

TABLE II sets forth compositions of several boroaluminosilicates and borosilicates that are related to the glasses of the invention, but do not provide the desired properties. These glass compositions are calculated in the manner described for those of TABLE I. Also, glasses were prepared, and properties measured, in the same manner as described with reference to TABLE I, except that loss tangent was measured at 100 KHz on all samples.

TABLE II

|  | 7 | 8 | 9 | 10 |
|---|---|---|---|---|
| $SiO_2$ | 72.8 | 66.4 | 59.7 | 63.0 |
| $B_2O_3$ | 11.3 | 26.8 | 17.7 | 24.5 |
| $Al_2O_3$ | 6.2 | — | 11.2 | — |
| $Li_2O$ | — | 1.2 | 0.5 | 1.1 |
| $Na_2O$ | 3.6 | — | — | — |
| $K_2O$ | — | 0.6 | 0.5 | 0.6 |
| CuO | 6.1 | 5.0 | 9.5 | 6.8 |
| CaO | — | — | 1.0 | — |
| $Fe_2O_3$ | — | — | — | 3.6 |
| Cl | — | — | — | 0.4 |
| K | 5.70 | 4.41 | 5.11 | 4.51 |
| LT | 0.014 | <0.001 | 0.003 | 0.006 |
| CTE | — | — | 28.1 | — |

The glass of Example 7, after heat treatment at 550° C., 650° C. and 770° C. failed to exude at any of the three temperatures. Likewise, the glass of Example 8 was heat treated at 450° C. and 700° C. and failed to exude at either temperature.

Example 9 illustrates the fact that CaO substitution for $Li_2O$ reduces the coefficient of thermal expansion markedly. While this can be beneficial, it must be used with caution. The glass of Example 10 exuded only slightly with heat treatment, and was non-conducting after hydrogen reduction.

The invention has thus far been described with reference to film formation of copper on glass samples. That is, of course, a useful application of the glasses, as well as being a convenient method of determining exudation characteristics in successive series of glass melts. However, a particular utility of our glasses is for thermal writing as disclosed in the companion application noted earlier as a related application.

As an example of that preferred aspect of the invention, metallic copper lines were produced directly on an optically flat glass substrate, that is, without hydrogen reduction. The composition of the glass substrate was that of Example 2 in TABLE I.

The substrate was rastered beneath an argon laser beam of 514 nm. wavelength operating at one watt power. Copper lines were formed with the beam traveling at different rates. These lines varied in width from 5-50 microns (0.2-2 mils), depending on the travel rate, and were a few tenths of a micron in depth.

The copper lines, as formed, were not electroconductive. It is thought this is caused by the rapid dendritic growth character of the copper during exposure to the laser beam. However, when the substrate was dipped in an electroless plating solution for a few minutes, the lines showed resistance values of 5-100 ohm-cm. while retaining their fine resolution.

While working with an argon laser, it is frequently desirable, although not a necessity, to include up to about 5% $Fe_2O_3$ in the glass composition. This assists in absorbing the optical energy and converting it to thermal energy.

```
                ;$NOLIST
1               INCLUDE 8096.ASC
1               ;###############################################################
1               ; 8096.INC - DEFINITION OF SYMBOLIC NAMES FOR THE I/O REGISTERS OF THE 8096
1               ;            (C) INTEL CORPORATION 1983
1               ;###############################################################
1               ;
10000 =         R0          EQU     000H        ;WORD:  R   ZERO REGISTER
10002 =         AD_CMD      EQU     002H        ;BYTE:  W
10002 =         AD_LO       EQU     002H        ;BYTE:  R
10003 =         AD_HI       EQU     003H        ;BYTE:  R
10003 =         HSI_MODE    EQU     003H        ;BYTE:  W
10004 =         HSO_TIME    EQU     004H        ;WORD:  W
10004 =         HSI_TIME    EQU     004H        ;WORD:  R
10006 =         HSI_STATUS  EQU     006H        ;BYTE:  R
10006 =         HSO_CMD     EQU     006H        ;BYTE:  R/W
10007 =         SBUF        EQU     007H        ;BYTE:  R/W
10008 =         INT_MASK    EQU     008H        ;BYTE:  R/W
10009 =         INT_PENDING EQU     009H        ;BYTE:  R/W
1000A =         WATCHDOG    EQU     00AH        ;BYTE:  W   WATCHDOG TIMER
1000A =         TIMER1      EQU     00AH        ;WORD:  R
1000C =         TIMER2      EQU     00CH        ;WORD:  R
1000E =         BAUD_RATE   EQU     00EH        ;BYTE:  W
1000E =         IOPORT0     EQU     00EH        ;BYTE:  R
1000F =         IOPORT1     EQU     00FH        ;BYTE:  R/W
10010 =         IOPORT2     EQU     010H        ;BYTE:  R/W
10011 =         SP_CON      EQU     011H        ;BYTE:  W
10014 =         HSO_REG     EQU     014H        ;BYTE:  R
10015 =         IOC0        EQU     015H        ;BYTE:  W
10015 =         IOS0        EQU     015H        ;BYTE:  R
10016 =         IOC1        EQU     016H        ;BYTE:  W
10016 =         IOS1        EQU     016H        ;BYTE:  R
10017 =         PWM_CONTROL EQU     017H        ;BYTE:  W
10017 =         IOS2        EQU     017H        ;BYTE:  R
10018 =         SP          EQU     018H        ;WORD:  R/W

1               INCLUDE DSE6.ASC            ;GET DATA ASSIGNMENTS
1BBE0                       ORG  0BBE0H
1
1BBE0           OLD_IA_M:       DS  18    ;INPUT AXIS CORRECTION MATRIX
1BBF2           LEVEL_M:        DS  18    ;LEVEL ROTATION MATRIX
1BC04           COMP_M:         DS  18    ;COMPOSITE MATRIX = [LEVEL]*[IA CORRECT]
```

```
IBC16           LOCAL_GRAV:     DS  2   ;LOCAL GRAVITY
IBC18           ROLL1:          DS  4   ;ROLL ANGLE AT POSITION 1
IBC1A =         PITCH1  EQU ROLL1+2     ;PITCH ANGLE AT POSITION 1
IBC1C           ROLL_GAIN:      DS  2   ;RADIANS/ACCEL BODY ROLL SENSITIVITY
IBC1E           PITCH_GAIN:     DS  2   ;RADIANS/ACCEL BODY PITCH SENSITIVITY
IBC20           OFFSET:         DS  2   ;OFFSET CHANNEL
IBC22           OVF_FLG:        DS  2   ;A/D CLIPPING FLAGS
IBC24           FILLER:         DS  2   ;
IBC26           BIN_ROLL_GAIN:  DS  2   ;BIN REPRESENTATION OF ROLL_GAIN
IBC28           BIN_PITCH_GAIN: DS  2   ;BIN REPRESENTATION OF PITCH_GAIN
IBC2A           TEMP_RAD_AG:    DS  2   ;TEMP STORAGE OF RADIAN ANGLE GAIN TIL PERMANENT ENTRY
;
IBC2C           ROLL_X_SLOW:    DS  2   ;AVERAGE X VECTOR DURING LOW SPEED ROLL RUN
IBC2E           ROLL_Y_SLOW:    DS  2   ;AVERAGE Y VECTOR DURING LOW SPEED ROLL RUN
IBC30           ROLL_Z_SLOW:    DS  2   ;AVERAGE Z VECTOR DURING LOW SPEED ROLL RUN
IBC32           ROLL_MAG_SLOW:  DS  2   ;AVERAGE OF MAGNITUDE DURING LOW SPEED ROLL RUN
;
IBC34           ROLL_X_FAST:    DS  2   ;AVERAGE X VECTOR DURING HIGH SPEED ROLL RUN
IBC36           ROLL_Y_FAST:    DS  2   ;AVERAGE Y VECTOR DURING HIGH SPEED ROLL RUN
IBC38           ROLL_Z_FAST:    DS  2   ;AVERAGE Z VECTOR DURING HIGH SPEED ROLL RUN
IBC3A           ROLL_MAG_FAST:  DS  2   ;AVERAGE OF MAGNITUDE DURING HIGH SPEED ROLL RUN
;
IBC3C           PITCH_X_SLOW:   DS  2   ;AVERAGE X VECTOR DURING SLOW SPEED PITCH RUN
IBC3E           PITCH_Y_SLOW:   DS  2   ;AVERAGE Y VECTOR DURING SLOW SPEED PITCH RUN
IBC40           PITCH_Z_SLOW:   DS  2   ;AVERAGE Z VECTOR DURING SLOW SPEED PITCH RUN
IBC42           PITCH_MAG_SLOW: DS  2   ;AVERAGE OF MAGNITUDE DURING LOW SPEED PITCH RUN
;
IBC44           PITCH_X_FAST:   DS  2   ;AVERAGE X VECTOR DURING HIGH SPEED PITCH RUN
IBC46           PITCH_Y_FAST:   DS  2   ;AVERAGE Y VECTOR DURING HIGH SPEED PITCH RUN
IBC48           PITCH_Z_FAST:   DS  2   ;AVERAGE Z VECTOR DURING HIGH SPEED PITCH RUN
IBC4A           PITCH_MAG_FAST: DS  2   ;AVERAGE OF MAGNITUDE DURING HIGH SPEED PITCH RUN
;
IBC4C           X_AVG:          DS  4   ;ACCUMULATER FOR AVERAGING X VECTOR
IBC50           Y_AVG:          DS  4   ;ACCUMULATER FOR AVERAGING Y VECTOR
IBC54           Z_AVG:          DS  4   ;ACCUMULATER FOR AVERAGING Z VECTOR
IBC58           MAG_AVG:        DS  4   ;ACCUMULATER FOR AVERAGING MAGNITUDE
;
IBC5C           AVG_COUNT:      DS  2   ;NUMBER OF SAMPLES ACCUMULATED FOR AVERAGING
;
IBC5E           KEY_TIMER:      DS  1   ;TIMER FOR KEY-STROKE PROCESSING
IBC5F           KEY_FLAG:       DS  1   ;FLAG FOR KEY-STROKE PROCESSING
;
IBC60           TEMP_GRAV:      DS  2   ;ACCELERATION OF GRAVITY
IBC62           CHAN_NUM:       DS  2   ;ACCELERATION OF GRAVITY
IBC64           DUMP_PTR:       DS  2   ;DATA DUMP POINTER
;
;               INCLUDE RSEG.ASC        ;GET REGISTER ASSIGNMENTS
;
;               ;***************************************************
;               ; Filename:  RSEG.ASC
;               ; Updated :  11/14/86    gec
;               ;***************************************************
;
;               ;GENERAL PURPOSE REGISTER STORAGE
;
I00A0                   ORG     0A0H
```

```
;
I00A0       AYL:    DS 4            ;1,2
I00A4       BYL:    DS 4            ;3,4
I00A8       CYL:    DS 4            ;5,6
I00AC       M11:    DS 2            ;7
I00AE       M12:    DS 2            ;8
;
;           ;****************************************
I00B0       M13:    DS 2            ;9 (0B0H)
I00B2       M21:    DS 2            ;10
I00B4       M22:    DS 2            ;11
I00B6       M23:    DS 2            ;12
I00B8       M31:    DS 2            ;13
I00BA       M32:    DS 2            ;14
I00BC       M33:    DS 2            ;15
I00BE       DY:     DS 2            ;16
;
;           ;****************************************
I00C0       EY:     DS 2            ;17 (0C0H)
I00C2       FY:     DS 2            ;18
I00C4       GY:     DS 2            ;19
I00C6       HY:     DS 2            ;20
I00C8       IY:     DS 2            ;21
I00CA       JY:     DS 2            ;22
I00CC       KY:     DS 2            ;23
I00CE       LY:     DS 2            ;24
;
;           ;****************************************
I00D0       NY:     DS 2            ;25 (0D0H)
I00D2       PY:     DS 2            ;26
I00D4       QY:     DS 2            ;27
I00D6       RY:     DS 2            ;28
;
I00CA =     LOCAL_6 EQU     JY
I00CC =     ROLL    EQU     KY
I00CE =     PITCH   EQU     LY

;GARY'S REGISTER ASSIGNMENTS/LABELS/VALUE EQUATES

0080 =      MODE_SW     EQU 080H    ;
007A =      MODE_TASK   EQU 07AH    ;
00E0 =      AD_CH0      EQU 0E0H    ; X AXIS A/D CHANNEL
00E2 =      AD_CH1      EQU 0E2H    ; Y AXIS A/D CHANNEL
00E4 =      AD_CH2      EQU 0E4H    ; Z AXIS A/D CHANNEL
00E6 =      AD_CH3      EQU 0E6H    ; 2.5 VOLT REF.
00E8 =      AD_CH4      EQU 0E8H    ; VOLT REF. AGND TO VREF.
00EA =      AD_CH5      EQU 0EAH    ; BATTERY SENSE.
005A =      D_CNTRL     EQU 05AH    ; DISPLAY CONTROL BYTE.
B870 =      DMI1A       EQU 0B870H  ; DOT MATRIX IMAGE BANK-1, PHASE A
B8E0 =      DMI1B       EQU 0B8E0H  ;                       , PHASE B
B9C0 =      DMI2A       EQU 0B9C0H  ;                 BANK 2, PHASE A
BA30 =      DMI2B       EQU 0BA30H  ;                       , PHASE B

006C =      ICON_P      EQU 06CH    ;
0081 =      MP_SME_C    EQU 081H    ;
00A0 =      MP_TEMP     EQU 0A0H
```

```
008A =          PNTR_T          EQU 08AH        ; TEMPORARY TARGET POINTER.
008E =          PNTR_T1         EQU 08EH        ; TEMPORARY TARGET POINTER 1.
0088 =          PNTR_S          EQU 088H        ; TEMPORARY SOURCE POINTER.
008C =          PNTR_S1         EQU 08CH        ; TEMPORARY SOURCE POINTER 1.
0086 =          LCNT            EQU 086H        ; TEMPORARY COUNTER REGISTER.
005B =          SS_DC           EQU 05BH        ; SEVEN SEGMENT PUNCTUATION CONTROL BYTE.
B857 =          SWR             EQU 0B857H      ; SWITCH JUST RECOGNIZED STATUS BYTE.
00B6 =          SS_6            EQU 0B6H        ; LSD OF BCD 6 TABLE
00BA =          SS_T            EQU 0BAH        ; LSD OF BCD TIME TABLE
0094 =          TEMP            EQU 094H        ; TEMPORARY TEMPORARY REGISTER.
                ;LOCAL DEFINITIONS

00F0 =          CAL_MODE        EQU 0F0H        ;WORD
00F2 =          BIN_A6          EQU 0F2H        ;WORD
00F4 =          RUN_T           EQU 0F4H        ;WORD
00F6 =          CAL_N           EQU 0F6H        ;WORD
00F8 =          KEY_TIME        EQU 0F8H        ;WORD
0094 =          TEMP2           EQU TEMP        ;WORD

40E0 =          PNTR_COLLAPSE   EQU 40E0H
40E3 =          PNTR_EXPAND     EQU 40E3H
40E6 =          CLEAR_ALL       EQU 40E6H
40E9 =          CLEAR_DMI1      EQU 40E9H
40EC =          CLEAR_SSI1      EQU 40ECH
40EF =          LOAD_ICON_DMI1  EQU 40EFH
40F2 =          CLEAR_DIG       EQU 40F2H
40F5 =          LOAD_SSI1       EQU 40F5H
40F8 =          MP_STOP         EQU 40F8H
40FB =          MP_START_SCALE  EQU 40FBH

;CODE
                ;CONSTANTS

0096 =          U_BOUND         EQU 150 ;UPPER BOUND ON MANUAL ENTRY OF ANGLE GAIN (15.0)
FFCE =          L_BOUND         EQU -50 ;LOWER BOUND ON MANUAL ENTRY OF ANGLE GAIN (-5.0)
0041 =          ROLL_INIT       EQU 65  ;DEFAULT ROLL GAIN (6.5)
0015 =          PITCH_INIT      EQU 21  ;DEFAULT PITCH GAIN (2.1)
000A =          INT_1           EQU 10  ;FIRST KEY INTERVAL FOR MANUAL ROLL GAIN ENTRY
0003 =          INT_N           EQU 3   ;REPEAT KEY INTERVAL FOR MANUAL ROLL GAIN ENTRY
000A =          BLANK_CODE      EQU 0AH ;CODE TO PRODUCE BLANK 7-SEGMENT CHARACTER
0014 =          MINUS_CODE      EQU 20  ;CODE TO PRODUCE "-" IN 7-SEGMENT DISPLAY

4100                    ORG 4100H       ;CSEG AT 4500H

4100 E76F08             LJMP    PROCESS_OFFSET
4103 E73B09             LJMP    PROCESS_SAMPLE_TRIAD1
4106 E7EF04             LJMP    MP_STRT_CAL
4109 E7C305             LJMP    ROT_MEM_INIT
410C E71509             LJMP    ROT_PWR_UP
410F E74932             LJMP    MAG_X_Y
4112 E7A903             LJMP    BIN_TO_BCD3
4115 E79003             LJMP    BIN_TO_TIME
4118 E7E904             LJMP    MP_STRT_CAL1
```

```
I                INCLUDE ROTATE.ASC
I
I                INCLUDE SQRT.ASC              ;GET SQUARE ROOT ROUTINE
I                ;**********************************************************************
I                ;SUBROUTINE:  SQRT
I                ;      INS:   ARG (LONG WORD)
I                ;     OUTS:   RESULT
I                ; DESTROYS:   ARG,TEMP,COUNT
I                ;    CALLS:   NONE
I                ; DESCRIPT:   CALCULATES SQUARE ROOT USING NEWTON ITERATION BEGINNING WITH A
I                ;             SEED VALUE ESTIMATED FROM THE MAGNITUDE OF THE INPUT
I                ;**********************************************************************
I00A0 =          ARG     EQU AYL
I00A4 =          RESULT  EQU BYL
I00A8 =          TEMP3   EQU CYL
I00D6 =          COUNT   EQU RY
I
I                SQRT:
I
I                ;CLEAR RESULT IN CASE ARGUMENT IS 0
I411B 01A4       CLR     RESULT
I
I                ;GENERATE SEED VALUE
I411D A0A2AA     LD      TEMP3+2,ARG+2      ;COPY ARG TO TEMP
I4120 A0A0A8     LD      TEMP3,ARG          ;
I4123 0FD6A8     NORML   TEMP3,COUNT        ;NORMALIZE TO DETERMINE ORDER OF MAGNITUDE
I4126 DF27       JE      DONE               ;DONE IF ARGUMENT WAS 0
I4128 1801D6     SHRB    COUNT,#1           ;ELSE, DIV BY 2
I
I412B A1FFFFA4   LD      RESULT,#0FFFFH     ;LOAD SEED
I412F 08D6A4     SHR     RESULT,COUNT       ;SCALE SEED VALUE
I
I4132 B105D6     LDB     COUNT,#5           ;SET PASS COUNTER FOR NUMBER OF ITERATIONS
I4135 A0A2AA     LOOP:  LD   TEMP3+2,ARG+2  ;COPY ARG TO TEMP3
I4138 A0A0A8            LD   TEMP3,ARG      ;
I413B 8CA4A8            DIVU TEMP3,RESULT   ;DIVIDE
I413E 01A6              CLR  RESULT+2       ;
I4140 64A8A4            ADD  RESULT,TEMP3   ;
I4143 A400A6            ADDC RESULT+2,0     ;
I4146 0C01A4            SHRL RESULT,#1      ;X 0.5
I4149 A400A4            ADDC RESULT,0       ;ROUND UPWARD
I414C E0D6E6            DJNZ COUNT,LOOP     ;CONTINUE TILL DONE
I414F F0         DONE:  RET                 ;RETURN FROM SQUARE ROOT ROUTINE

I                $PAGE
I                INCLUDE SINCOS.ASC          ;GET TRIG ROUTINES
I                ;NUMBERS ARE HANDLED IN THE FOLLOWING FORMAT USING 2'S COMP INTEGER ARITHMETIC:
I
I                ;S-D14-D13.D12-D11------D1-D0     1.0 --> 2**13 = 2000H
I
I
I                ;**********************************************************************
I                ;SUBROUTINE:  SINCOS
I                ;      INS:   WORD AT ARG (RADIANS)
I                ;     OUTS:   SIN OUTPUT WORD AT SIN
I                ;             COS OUTPUT WORD AT COS
```

```
I          ; DESTROYS:  TEMP1
I          ;    CALLS:  NONE
I          ; DESCRIPT:  APPROXIMATIONS:  COS(X)=1-(X**2)/2   ERROR IS LESS THAN (X**4)/24
I          ;                             SIN(X)= X-(X**3)/6  ERROR IS LESS THAN (X**5)/120
I          ;*************************************************************************
I
I                  SINCOS:
I
I00BE =     SIN     EQU     DY
I00C0 =     COS     EQU     EY
I00A4 =     TEMP1   EQU     BYL
I
I                         ;GENERATE (X**2)/2
I4150 FE4CA0A0           MUL    TEMP1,ARG,ARG   ;X**2
-4154 A4
I4155 0E0EA4             SHRAL  TEMP1,#14       ;RESTORE MAGNITUDE * 0.5 = (X**2)/2
I415B A10020C0           LD     COS,#2000H      ;CALCULATE 1-(X**2)/2
I415C 6BA4C0             SUB    COS,TEMP1       ;
I415F FE6CA0A4           MUL    TEMP1,ARG       ;CALCULATE X**3
I4163 FEBD0060           DIV    TEMP1,#6000H    ;RESTORE MAGNITUDE/3 ---> (X**3)/6
-4167 A4
I4168 A0A0BE             LD     SIN,ARG         ;LOAD FIRST TERM
I416B 6BA4BE             SUB    SIN,TEMP1       ;SUB SECOND TERM
I416E F0                 RET                    ;RETURN FROM SINCOS
I
I          ;*************************************************************************
I          ;SUBROUTINE: ARCSIN
I          ;     INS:  WORD AT ARG
I          ;    OUTS:  OUTPUT WORD AT A_SIN (RADIANS)
I          ; DESTROYS:  TEMP1
I          ;    CALLS:  NONE
I          ; DESCRIPT:  APPROXIMATIONS:  ARCSIN(X)=X+(X**3)/6   NEXT TERM 3(X**5)/40
I          ;*************************************************************************
I
I                  ARCSIN:
I
I00BE =     A_SIN   SET     DY
I
I                         ;GENERATE (X**2)/2
I416F FE4CA0A0           MUL    TEMP1,ARG,ARG   ;X**2
-4173 A4
I4174 0E0EA4             SHRAL  TEMP1,#14       ;RESTORE MAGNITUDE  (X**2)/2
I4177 FE6C40A4           MUL    TEMP1,ARG       ;CALCULATE (X**3)/2
I417B FEBD0060           DIV    TEMP1,#06000H   ;RESTORE MAGNITUDE/3 ---> (X**3)/6
-417F A4
I4180 A0A0BE             LD     A_SIN,ARG       ;LOAD FIRST TERM
I4183 64A4BE             ADD    A_SIN,TEMP1     ;ADD SECOND TERM
I4186 F0                 RET                    ;RETURN FROM ARCSIN

I          $PAGE
I          ;*************************************************************************
I          ;SUBROUTINE: ARCTAN
I          ;     INS:  WORD AT ARG
I          ;    OUTS:  WORD AT A_TAN (RADIANS)
I          ; DESTROYS:  TEMP1,TEMP,ARG
I          ;    CALLS:  INVTAN
```

```
I         ; DESCRIPT: THE INPUT ARGUMENT IS TESTED FOR RESULTS EXCEEDING
I         ;           PI/8 (22.5 DEGREES) IN MAGNITUDE. FOR POSITIVE RESULTS EXCEEDING
I         ;           PI/8, THE RELATIONSHIP TAN(ARG) = TAN(X+PI/8)= (1+TAN(X))/(1-TAN(X))
I         ;           IS USED TO REDUCE THE ARGUMENT MAGNITUDE SO THAT A TURCATED SERIES
I         ;           WILL BETTER APPROXIMATE THE ARCTAN FUNCTION. IN THIS CASE,
I         ;           TAN(X)= (ARG-1)/(ARG+1).
I         ;           HENCE, ATAN (ARG)= ATAN((ARG-1)/(ARG+1))+PI/8
I         ;           A SIMILAR RELATIONSHIP IS USED FOR NEGATIVE ANGLES.
I         ;
I         ;**************************************************************************
I
I                 ARCTAN:
I
I00BE =          A_TAN           EQU     DY
I0D41 =          TAN_PI_OVR_8    EQU     3393    ;TAN(PI/8)*2000H
I1922 =          PI_OVR_4        EQU     6434    ;PI/4 *2000H
I
I
I41B7 89410DA0           CMP     ARG,#TAN_PI_OVR_8    ;COMPARE WITH TAN(PI/8)
I41BB D227              JGT     ANG_GT               ;JUMP IF ANGLE > PI/8
I41BD 89BFF2A0          CMP     ARG,#-TAN_PI_OVR_8   ;COMPARE WITH TAN(-PI/8)
I4191 DE03              JLT     ANG_LT               ;JUMP IF ANGLE < PI/8
I4193 283D              SCALL   INVTAN               ;ELSE, MAGNITUDE OF ANGLE < PI/8. COMPUTE ATAN
I4195 F0                RET                          ;RETURN FROM ARCTAN
I
I                        ;COMPUTE (1+ARG)/(1-ARG)
I4196 A10020A4  ANG_LT: LD      TEMP1,#2000H         ;COMPUTE 1-ARG
I419A 68A0A4            SUB     TEMP1,ARG            ;
I419D 650020A0          ADD     ARG,#2000H           ;COMPUTE 1+ARG
I41A1 A0A0A2            LD      ARG+2,ARG            ;PREPARE DIVIDEND
I41A4 01A0              CLR     ARG                  ;
I41A6 0E03A0            SHRAL   ARG,#3               ;
I41A9 FEBCA4A0          DIV     ARG,TEMP1            ;DIVIDE (1+ARG)/(1-ARG)
I41AD 2823              SCALL   INVTAN               ;COMPUTE ARCTAN OF REDUCED ARGUMENT
I41AF 692219BE          SUB     A_TAN,#PI_OVR_4      ;SUBTRACT PI/4 DIFFERENCE ANGLE
I41B3 F0                RET                          ;RETURN FROM ARCTAN
I
I                        ;COMPUTE (ARG-1)/(ARG+1)
I41B4 A0A0A4   ANG_GT:  LD      TEMP1,ARG            ;COMPUTE ARG+1
I41B7 650020A4          ADD     TEMP1,#2000H         ;
I41BB 690020A0          SUB     ARG,#2000H           ;COMPUTE ARG-1
I41BF A0A0A2            LD      ARG+2,ARG            ;PREPARE DIVIDEND
I41C2 01A0              CLR     ARG                  ;
I41C4 0E03A0            SHRAL   ARG,#3               ;
I41C7 FEBCA4A0          DIV     ARG,TEMP1            ;DIVIDE (ARG-1)/(ARG+1)
I41CB 2805              SCALL   INVTAN               ;
I41CD 652219BE          ADD     A_TAN,#PI_OVR_4      ;
I41D1 F0                RET                          ;RETURN FROM ARCTAN

I               $PAGE
I               ;**************************************************************************
I               ;SUBROUTINE: INVTAN
I               ;       INS: WORD AT ARG
I               ;      OUTS: OUTPUT WORD AT A_TAN
I               ;  DESTROYS: TEMP1
I               ;     CALLS: NONE
I               ; DESCRIPT: APPROXIMATIONS: ARCTAN(X)=X-(X**3)/3   NEXT TERM +(X**5)/5
I               ;**************************************************************************
```

```
;
;               INVTAN:
;
;                       ;GENERATE (X**2)/2
141D2 FE4CA0A0          MUL     TEMP1,ARG,ARG   ;X**2
-41D6 A4
141D7 0E0DA4            SHRAL   TEMP1,#13       ;RESTORE MAGNITUDE  (X**2)
141DA FE6CA0A4          MUL     TEMP1,ARG       ;CALCULATE (X**3)
141DE FE8D0060          DIV     TEMP1,#06000H   ;RESTORE MAGNITUDE/3 ---> (X**3)/3
-41E2 A4
141E3 A0A0BE            LD      A_TAN,ARG       ;LOAD FIRST TERM
141E6 68A4BE            SUB     A_TAN,TEMP1     ;ADD SECOND TERM
141E9 F0                RET                     ;RETURN FROM INVTAN

;               $PAGE
;
;               INCLUDE MATMUL.ASC              ;GET MATRIX ARITHMETIC ROUTINES
;               ;****************************************************************
;               ;SUBROUTINE: MAT_VECT3
;               ;       INS: 3 ELEMENT WORD VECTOR AT X_IN
;               ;            3X3 WORD MATRIX AT M11, ORDERED ROW1,ROW2,ROW3
;               ;      OUTS: 3 ELEMENT WORD VECTOR AT X_OUT
;               ;  DESTROYS: MAT_PTR,VECT_IN_PTR,VECT_OUT_PTR,ROW_INDEX,COL_INDEX,MUL_RES,
;               ;            SUM_PROD
;               ;     CALLS: NONE
;               ;   DESCRIPT:
;               ;****************************************************************
;               ;               GENERAL REGISTER EQUATES
100BE =         X_OUT   EQU DY          ;X VECTOR OUTPUT
100C0 =         Y_OUT   EQU EY          ;Y VECTOR OUT
100C2 =         Z_OUT   EQU FY          ;Z VECTOR OUT
;
100E0 =         X_IN    EQU AD_CH0      ;X VECTOR IN
100E2 =         Y_IN    EQU AD_CH1      ;Y VECTOR IN
100E4 =         Z_IN    EQU AD_CH2      ;Z VECTOR IN
;
100A0 =         MUL_RES         EQU AYL ;LONG WORD RESULT OF MATRIX ELEMENT*INPUT ELEMENT
100A4 =         SUM_PROD        EQU BYL ;SUM OF PRODUCTS OF MATRIX MULTIPLICATION
100D4 =         VECT_IN         EQU QY  ;INPUT VECTOR OPERAND DURING MULTIPLICATIONS
100CA =         VECT_IN_PTR     EQU JY  ;POINTER TO INPUT VECTOR ELEMENT
100CC =         VECT_OUT_PTR    EQU KY  ;POINTER TO OUTPUT VECTOR ELEMENT
100CE =         MAT_PTR         EQU LY  ;POINTER TO MATRIX ELEMENTS
100D0 =         COL_INDEX       EQU NY  ;COLUMN INDEX COUNTER
100D2 =         ROW_INDEX       EQU PY  ;ROW INDEX COUNTER
;               ;****************************************************************
;               MAT_VECT3:      ;SUBROUTINE TO PERFORM MATRIX MULTIPLICATION [3X3][1X3]
;                       ;INPUTS: 3 ELEMENT WORD VECTOR AT X_IN
;                       ;        3X3 WORD MATRIX AT M11, ORDERED WITH COLUMNS AS SHOWN
;                       ;OUTPUTS: 3 ELEMENT WORD VECTOR AT X_OUT
;
141EA A1AC00CE          LD      MAT_PTR,#M11            ;LOAD POINTER TO MATRIX ELEMENTS
141EE A1BE00CC          LD      VECT_OUT_PTR,#X_OUT     ;LOAD POINTER TO OUTPUT VECTOR
141F2 B103D2            LDB     ROW_INDEX,#3            ;LOAD COUNTER FOR 3 ROWS
;
141F5 B103D0    ROWL:   LDB     COL_INDEX,#3            ;LOAD COUNTER FOR 3 COLUMNS
141F8 A1E000CA          LD      VECT_IN_PTR,#X_IN       ;LOAD POINTER TO INPUT VECTOR
```

```
I41FC 01A4              CLR     SUM_PROD            ;CLEAR SUM OF PRODUCTS
I41FE 01A6              CLR     SUM_PROD+2          ;
I
I4200 A2CBA0    COWL:   LD      MUL_RES,[VECT_IN_PTR]+  ;LOAD VECTOR INPUT OPERAND
I4203 FE6ECFA0          MUL     MUL_RES,[MAT_PTR]+  ;MULTIPLY ELEMENT
I4207 64A0A4            ADD     SUM_PROD,MUL_RES    ;ADD LOW WORD OF RESULT
I420A A4A2A6            ADDC    SUM_PROD+2,MUL_RES+2 ;ADD HIGH WORD OF RESULT
I420D E0D0F0            DJNZ    COL_INDEX,COWL      ;REPEAT TIL EACH ROW MULTIPLY DONE
I4210 0E0DA4            SHRAL   SUM_PROD,#13        ;NORMALIZE RESULT
I4213 C2CDA4            ST      SUM_PROD,[VECT_OUT_PTR]+;STORE RESULT
I4216 E0D2DC            DJNZ    ROW_INDEX,ROWL      ;REPEAT INNER LOOP TILL ALL ROWS DONE
I
I4219 F0                RET                         ;RETURN FROM MAT_MUL

I               $PAGE
I               ;***********************************************************************
I               ;SUBROUTINE: MAT_MAT
I               ;       INS: 3X3 WORD MATRIX [A]
I               ;            A_PTR = POINTER TO MATRIX [A]
I               ;            3X3 WORD MATRIX [B], MUST LIE WITHIN REGISTER SPACE
I               ;            B_PTR = POINTER TO MATRIX [B]
I               ;            C_PTR = POINTER TO OUTPUT MATRIX [C]
I               ;      OUTS: 3X3 WORD MATRIX [C]
I               ; DESTROYS: ROW_INDEX,COL_INDEX,CPL_INDEX,SUM_PROD,MUL_RES,A_PTR,B_PTR,C_PTR
I               ;    CALLS: NONE
I               ;  DESCRPT: PERFORMS MATRIX MULTIPLY [3X3][3X3] [C]=[B][A]
I               ;***********************************************************************
I               ;            GENERAL REGISTER EQUATES
I00D6 =         CPL_INDEX   EQU RY
I00CA =         A_PTR       EQU JY
I00CE =         B_PTR       EQU LY
I00CC =         C_PTR       EQU KY
I               ;***********************************************************************
I               MAT_MAT:
I421A B103D2            LDB     ROW_INDEX,#3        ;LOAD COUNTER FOR 3 ROWS
I
I421D B103D0    ROWL1:  LDB     COL_INDEX,#3        ;LOAD COUNTER FOR 3 COLUMNS
I4220 01A4      COL1:   CLR     SUM_PROD            ;CLEAR SUM OF PRODUCTS
I4222 01A6              CLR     SUM_PROD+2          ;
I
I4224 B103D6            LDB     CPL_INDEX,#3        ;LOAD COUNTER FOR 3 PRODUCTS/ELEMENT
I               CPL:    ;SUM OF PRODUCS LOOP TO CALCULATE EACH ELEMENT IN [C]
I4227 A2CAA0            LD      MUL_RES,[A_PTR]     ;LOAD VECTOR INPUT OPERAND
I422A FE6ECFA0          MUL     MUL_RES,[B_PTR]+    ;MULTIPLY ELEMENT
I422E 64A0A4            ADD     SUM_PROD,MUL_RES    ;ADD LOW WORD OF RESULT
I4231 A4A2A6            ADDC    SUM_PROD+2,MUL_RES+2 ;ADD HIGH WORD OF RESULT
I4234 650600CA          ADD     A_PTR,#6            ;BUMP POINTER TO NEXT ROW DOWN (+3 WORDS)
I4238 E0D6EC            DJNZ    CPL_INDEX,CPL       ;REPEAT TIL EACH ROW MULTIPLY DONE
I423B 0E0DA4            SHRAL   SUM_PROD,#13        ;NORMALIZE RESULT
I423E C2CDA4            ST      SUM_PROD,[C_PTR]+   ;STORE RESULT
I4241 690600CE          SUB     B_PTR,#6            ;POINT TO BEGINNING OF ROW (-3 WORDS)
I4245 691000CA          SUB     A_PTR,#16           ;POINT TO BEGINNING OF NEXT COL (-8 )
I
I4249 E0D0D4            DJNZ    COL_INDEX,COL1      ;REPEAT INNER LOOP ALL ELEMENTS IN ROW
I424C 650600CE          ADD     B_PTR,#6            ;POINT TO BEGINNING OF NEXT ROW (+3)
I4250 690600CA          SUB     A_PTR,#6            ;POINT TO BEGINNING OF NEXT COLUMN (+3)
```

```
I
14254 E0D2C6          DJNZ    ROW_INDEX,ROWL1        ;REPEAT OUTER LOOP FOR 3 ROWS
I
14257 F0              RET                            ;RETURN FROM MAT_MAT

I             $PAGE
I             ;**********************************************************************
I             ;SUBROUTINE: VECT_TO_XYZ
I             ;     INS:  SOURCE = ADDRESS AT BOTTOM OF ARRAY (WORD)
I             ;     OUTS: VECTOR AT X_IN,Y_IN,Z_IN
I             ; DESTROYS: VECT_IN,SOURCE,DEST,COUNT
I             ;   CALLS:  NONE
I             ; DESCRIPT: COPIES 3-WORD VECTOR TO X_IN
I             ;**********************************************************************
I             VECT_TO_XYZ:
I
14258 A1E000CC        LD      DEST,#X_IN     ;LOAD DESTINATION
1425C B103D6          LDB     COUNT,#3       ;COPY 3 WORD VECTOR
1425F 2000            SJMP    COPY           ;JUMP TO COMPLETE TRANSFER
I
I             ;**********************************************************************
I             ;SUBROUTINE: COPY
I             ;     INS:  SOURCE = ADDRESS AT BOTTOM OF ARRAY (WORD)
I             ;           DEST   = ADDRESS AT BOTTOM OF ARRAY (WORD)
I             ;           COUNT  = NUMBER OF WORDS TO BE COPIED (BYTE)
I             ;     OUTS: DUPLICATE AT DEST
I             ; DESTROYS: VECT_IN,SOURCE,DEST,COUNT
I             ;   CALLS:  NONE
I             ; DESCRIPT: COPIES WORD ARRAY BETWEEN REGISTERS AND RAM
I             ;**********************************************************************
I             ;             GENERAL REGISTER EQUATES
100CA =       SOURCE  EQU  JY
100CC =       DEST    EQU  KY
I             ;**********************************************************************
I             COPY:
14261 A2CBD4  COPY_L: LD      VECT_IN,[SOURCE]+      ;GET SOURCE WORD
14264 C2CDD4          ST      VECT_IN,[DEST]+        ;TRANSFER WORD
14267 E0D6F7          DJNZ    COUNT,COPY_L           ;REPEAT TILL DONE
1426A F0              RET                            ;RETURN FROM COPY_L
I
I             ;**********************************************************************
I             ;SUBROUTINE: COPYB
I             ;     INS:  SOURCE = ADDRESS AT BOTTOM OF ARRAY (WORD)
I             ;           DEST   = ADDRESS AT BOTTOM OF ARRAY (WORD)
I             ;           COUNT  = NUMBER OF WORDS TO BE COPIED (BYTE)
I             ;     OUTS: DUPLICATE AT DEST
I             ; DESTROYS: VECT_IN,SOURCE,DEST,COUNT
I             ;   CALLS:  NONE
I             ; DESCRIPT: COPIES BYTE ARRAY BETWEEN REGISTERS AND RAM
I             ;**********************************************************************
I             COPYB:
1426B B2CBD4  COPYB_L:        LDB     VECT_IN,[SOURCE]+      ;GET SOURCE WORD
1426E C6CDD4                  STB     VECT_IN,[DEST]+        ;TRANSFER WORD
14271 E0D6F7                  DJNZ    COUNT,COPYB_L          ;REPEAT TILL DONE
14274 F0                      RET                            ;RETURN FROM COPYB_L
```

```
                $PAGE
                ;***************************************************************
                ;SUBROUTINE: PROCESS_SAMPLE_TRIAD
                ;     INS: X_IN,Y_IN,Z_IN
                ;    OUTS: X_IN=X_OUT,Y_IN=Y_OUT,Z_IN=Z_OUT
                ;DESTROYS: SOURCE,DEST,VECT_IN,MAT_PTR,VECT_OUT_PTR,ROW_INDEC,COL_INDEX,
                ;          MUL_RES,SUM_PROD,TEMP1,ARG,VECT_IN_PTR,COUNT
                ;   CALLS: ROTATE_TO_LEVEL,CALC_PITCH_ROLL_MATRIX,ROTATE_VECT,SCALE_CLIP
                ;DESCRIPT:
                ;          1. PROCESS INPUT OFFSET & SET FLAGS FOR CHANNELS IN CLIPPING
                ;          2. COPY COMPOSITE ROTATION MATRIX TO REGISTER SPACE
                ;          3. CALCULATE BODY ALIGNED VECTORS
                ;          4. CALCULATE ACCEL INDUCED PITCH & ROLL ANGLES
                ;             AND THEIR RESPECTIVE SINES & COSINES
                ;          5. CALCULATE BODY PITCH & ROLL CORRECTION MATRIX
                ;          6. CALCULATE PLANE OF ROAD ACCELERATION VECTORS
                ;          7. SCALE & CLIP RESULTS TO 9-BIT 2'S COMP NUMBERS
                ;          8. SET OUTPUTS IN CLIPPING IN COMPLIANCE WITH CLIPPING FLAGS
                ;          9. RETURN
                ;***************************************************************

PROCESS_SAMPLE_TRIAD:           ;PROCESS ACCELEROMETER INPUTS

;PROCESS INPUT OFFSET & SET FLAGS FOR CHANNELS IN CLIPPING
14275 EFFA06    LCALL   PROCESS_OFFSET

;CALCULATE BODY ALIGNED VECTORS
14278 2906      SCALL   ROTATE_TO_LEVEL

;CALCULATE ACCELERATION INDUCED PITCH & ROLL ANGLES
                IF 0
                MUL     TEMP,Y_IN,PITCH_GAIN    ;CALCULATE PITCH ANGLE
                DIV     TEMP,#1600              ;DIVIDE BY 1 G

MUL     ARG,X_IN,ROLL_GAIN      ;CALCULATE ROLL ANGLE
                DIV     ARG,#1600               ;DIVIDE BY 1 G
                ENDIF

;ESTIMATE PITCH ANGLE: PITCH=Y_IN/G*PITCH_GAIN/(1+Z_IN*PITCH_GAIN/G)

1427A FE4F011E  MUL     TEMP1,Z_IN,PITCH_GAIN
-427E BCE4A4
14281 FE8D4006  DIV     TEMP1,#1600     ;DIVIDE BY 1 G
-4285 A4
14286 650020A4  ADD     TEMP1,#2000H    ;ADD 1 (SCALED)
1428A FE4F011E  MUL     TEMP,Y_IN,PITCH_GAIN    ;
-428E BCE284
14291 FE8D4006  DIV     TEMP,#1600      ;DIVIDE BY 1 G
-4295 84
14296 A08486    LD      TEMP+2,TEMP     ;PREPARE FOR DIVISION
14299 0184      CLR     TEMP            ;
1429B 0E0384    SHRAL   TEMP,#3         ;
1429E FE8CA484  DIV     TEMP,TEMP1      ;

;ESTIMATE ROLL ANGLE: ROLL=X_IN/G*ROLL_GAIN/(1+Z_IN*ROLL_GAIN/G)
```

```
I
I42A2 FE4F011C        MUL     TEMP1,Z_IN,ROLL_GAIN
-42A6 BCE4A4
I42A9 FE8D4006        DIV     TEMP1,#1600     ;DIVIDE BY 16
-42AD A4
I42AE 650020A4        ADD     TEMP1,#2000H    ;ADD 1 (SCALED)
I42B2 FE4F011C        MUL     ARG,X_IN,ROLL_GAIN   ;
-42B6 BCE0A0
I42B9 FE8D4006        DIV     ARG,#1600       ;DIVIDE BY 16
-42BD A0
I42BE A0A0A2          LD      ARG+2,ARG       ;PREPARE FOR DIVISION
I42C1 01A0            CLR     ARG             ;
I42C3 0E03A0          SHRAL   ARG,#3          ;
I42C6 FE8CA4A0        DIV     ARG,TEMP1       ;
I
I                     ;CALCULATE BODY PITCH & ROLL CORRECTION MATRIX
I42CA 2848            SCALL   CALC_PITCH_ROLL_MATRIX
I
I                     ;CALCULATE PLANE OF ROAD ACCELERATION VECTORS
I42CC 289C            SCALL   ROTATE_VECT     ;
I
I42CE 2925            SCALL   MAG2            ;CALCULATE RESULTANT OF X & Y
I42D0 0A04A4          SHRA    RESULT,#4       ;ADJUST THE RESULTANT
I
I                     ;SCALE & CLIP X_OUT & Y_OUT TO 9-BIT 2'S COMP NUMBERS
I
I42D3 A1BE00CA        LD      A_PTR,#X_OUT    ;ADJUST THE X VECTOR
I42D7 2806            SCALL   SCALE_CLIP      ;
I
I                     ;LD     A_PTR,#Y_IN     ;ADJUST THE Y VECTOR
I42D9 2804            SCALL   SCALE_CLIP      ;
I
I                     ;SET OUTPUTS IN CLIPPING IN COMPLIANCE WITH CLIPPING FLAGS
I42DB EFCF06          LCALL   OUT_CLIP
I
I42DE F0              RET                     ;RETURN FROM PROCESS_SAMPLE_TRIAD

I              $PAGE
I              ;*******************************************************************
I              ;SUBROUTINE: SCALE_CLIP
I              ;     INS: A_PTR = POINTER TO RESULT INPUT
I              ;     OUTS: ADJUSTED OUTPUT @ A_PTR
I              ;            A_PTR=A_PTR+2
I              ; DESTROYS: VECT_IN
I              ;    CALLS: NONE
I              ; DESCRIPT: SCALE & CLIP RESULTS TO 9-BIT 2'S COMP NUMBERS
I              ;*******************************************************************
I
I              SCALE_CLIP:
I
I42DF A2CAD4          LD      VECT_IN,[A_PTR] ;GET INPUT
I42E2 0A04D4          SHRA    VECT_IN,#4      ;SCALE TO 9 BIT NUMBER
I42E5 A400D4          ADDC    VECT_IN,0       ;ROUND RESULT
I42E8 89FF00D4        CMP     VECT_IN,#0FFH   ;TEST IF RESULT > 00FF
I42EC D208            JGT     CLIP_HI         ;JUMP IF >
```

```
142EE 8900FFD4            CMP    VECT_IN,#0FF00H    ;TEST IF RESULT < 0FF00
142F2 DE09                JLT    CLIP_LO            ;JUMP IF <
142F4 200A                SJMP   ST_OUT             ;JUMP TO STORE OUTPUT
;
142F6 A1FF00D4  CLIP_HI:  LD     VECT_IN,#0FFH      ;SET OUTPUT TO UPPER BOUND
142FA 2004                SJMP   ST_OUT             ;JUMP TO STORE OUTPUT
;
142FC A100FFD4  CLIP_LO:  LD     VECT_IN,#0FF00H    ;SET OUPUT TO LOWER BOUND
;
14300 C2C5D4    ST_OUT: ST       VECT_IN,[A_PTR]+   ;STORE OUTPUT @ A_PTR
14303 F0                  RET                       ; & RETURN FROM SCALE_CLIP
;
;       ;****************************************************************
;       ;SUBROUTINE: AVERAGE
;       ;      INS: A_PTR = POINTER TO RUNNING AVERAGE
;       ;           ARG = CURRENT INPUT
;       ;     OUTS: UPDATED AVERAGE @ A_PTR
;       ; DESTROYS: TEMP
;       ;    CALLS: NONE
;       ; DESCRIPT: UPDATE RUNNING AVERAGE. USES AVG = AVG + (AVG-ARG)/2**3
;       ;****************************************************************
;
;               AVERAGE:
;
14304 A2CA84              LD     TEMP,[A_PTR]
14307 68A084              SUB    TEMP,ARG
1430A 0A0384              SHRA   TEMP,#3
1430D 66CA84              ADD    TEMP,[A_PTR]
14310 C2CA84              ST     TEMP,[A_PTR]
14313 F0                  RET                       ;RETURN FROM AVERAGE

;       $PAGE
;       ;****************************************************************
;       ;SUBROUTINE: CALC_PITCH_ROLL_MATRIX
;       ;      INS: ARG = ROLL ANGLE (RADIANS)
;       ;           TEMP = PITCH ANGLE (RADIANS)
;       ;    CALLS: SINCOS
;       ;     OUTS: ROTATION MATRIX DEFINED BELOW:
;       ; DESTROYS: TEMP1,ARG
;       ;    CALLS: SINCOS
;       ; DESCRIPT:
;       ;[PITCH]*[ROLL](T) =   COS(R)        -SIN(P)SIN(R)     -COS(P)SIN(R)
;       ;                      0              COS(P)           -SIN(P)
;       ;                      SIN(R)         SIN(P)COS(R)      COS(P)COS(R)
;       ;
;       ;WHERE P= PITCH & R= ROLL (SEE DYNAMIC CORRECTIONS ANAL 4-25-86)
;       ;****************************************************************
;
;               CALC_PITCH_ROLL_MATRIX:
;
14314 2E3A                SCALL  SINCOS             ;CALCULATE SINE & COSINE OF ROLL ANGLE
14316 A0BEB8              LD     M31,SIN            ;SAVE SINE(ROLL)
14319 A0C0AC              LD     M11,COS            ;SAVE COS(ROLL)
;
1431C A084A0              LD     ARG,TEMP           ;COPY PITCH ANGLE TO INPUT TO SINCOS ROUTINE
1431F 2E2F                SCALL  SINCOS             ;CALCULATE SINE & COSINE OF PITCH ANGLE
```

```
14321 A0EE96         LD      M23,SIN         ;SAVE SINE(PITCH)
14324 A0C084         LD      M22,COS         ;SAVE COS(PITCH)
!
14327 FE4CACB4       MUL     ARG,M22,M11     ;CALCULATE COS(P)COS(R)
-432B A0
1432C 0E0DA0         SHRAL   ARG,#13         ;NORMALIZE PRODUCT
1432F A0A0BC         LD      M33,ARG         ;SAVE RESULT
!
14332 FE4CACB6       MUL     ARG,M23,M11     ;CALCULATE SIN(P)COS(R)
-4336 A0
14337 0E0DA0         SHRAL   ARG,#13         ;NORMALIZE PRODUCT
1433A A0A0BA         LD      M32,ARG         ;SAVE RESULT
!
1433D FE4CB884       MUL     ARG,M22,M31     ;CALCULATE COS(P)SIN(R)
-4341 A0
14342 0E0DA0         SHRAL   ARG,#13         ;NORMALIZE PRODUCT
14345 A0A0B0         LD      M13,ARG         ;SAVE RESULT
!
14348 03B0           NEG     M13             ;CONVERT COS(P)SIN(R) TO NEGATIVE
!
1434A 03B6           NEG     M23             ;CONVERT SIN(P) TO NEGATIVE
!
1434C FE4CB886       MUL     ARG,M23,M31     ;CALCULATE -SIN(P)SIN(R)
-4350 A0
14351 0E0DA0         SHRAL   ARG,#13         ;NORMALIZE PRODUCT
14354 A0A0AE         LD      M12,ARG         ;SAVE RESULT
!
14357 A000E2         LD      M21,0           ;LOAD 0 ELEMENT
!
1435A F0             RET                     ;RETURN FROM CALC_PITCH_ROLL_MATRIX

!               $PAGE
!               ;*************************************************************
!               ;SUBROUTINE: MAG_X_Y
!               ;      INS: X_IN,Y_IN (9BIT 2'S COMP FORMAT)
!               ;     OUTS: RESULT
!               ;  DESTROYS: X_IN,Y_IN,COUNT,A_PTR,ARG,TEMP
!               ;    CALLS: MAG2
!               ; DESCRIPT: CALCULATE THE RESULTANT OF X & Y (9-BIT 2'S COMP FORMAT)
!               ;*************************************************************
!
!               MAG_X_Y:
!
1435B 0904E0         SHL     X_IN,#4         ;SHIFT WORDS TO ENSURE PRECISION IN MAG2
1435E 0904E2         SHL     Y_IN,#4         ;
14361 2892           SCALL   MAG2            ;CALCULATE RESULTANT OF X & Y
14363 0A04A4         SHRA    RESULT,#4       ;SCALE RESULT TO ORIGINAL
14366 A400A4         ADDC    RESULT,0        ;ROUND UPWARD
14369 F0             RET                     ;RETURN FROM MAG_X_Y

!               $PAGE
!                       IF 0    ;DISABLE ASSEMBLY
!
!                       LD      A_PTR,#CAL12_TAB        ;POINT TO CAL12 MODE TABLE
!                       SCALL   SEARCH_CAL_N            ;SEARCH TABLE
```

```
                JE      C12                     ;IF CAL_MODE 1 OR 2, JUMP

;TEST IF CAL_MODE 4,5,8 OR 9 IS ACTIVE
                LD      A_PTR,#CAL4589_TAB      ;POINT TO CAL12 MODE TABLE
                SCALL   SEARCH_CAL_N            ;SEARCH TABLE
                JE      PST_R   ;IF CAL_MODE 4,5,8 OR 9, RETURN WITH BODY ALIGNED DATA

C12:            ;CORRECT INPUT AXIS MIS_ALIGNMENT & RETURN
                ;COPY INPUT AXIS CORRECTION ROTATION MATRIX TO REGISTER SPACE
                LD      SOURCE,#IA_M    ;POINT TO INPUT AXIS CORRECTION MATRIX IN RAM
                SCALL   MATRIX_TO_REGS  ;

;CALCULATE INSTRUMENT CASE ALIGNED VECTORS
                SCALL   ROTATE_VECT     ;ROTATE INPUT VECTORS TO INSTRUMENT CASE
                RET             ;RETURN FROM PROCESS_SAMPLE_TRIAD WITH UN-LEVELED DATA

;***************************************************************************
;SUBROUTINE:    SEARCH_CAL_N
;       INS:    A_PTR = POINTER TO TABLE OF CAL_N MODES TO BE RECOGNIZED (BYTES)
;               TABLE OF MODES IN DESCENDING MAGNITUDE AT HIGHER ADDRESS.
;               FINAL ENTRY MUST BE 0.
;       OUTS:   Z FLAG = 1 IF CAL_N IS LISTED IN TABLE
; DESTROYS:     A_PTR
;       CALLS:  NONE
; DESCRIPT:
;***************************************************************************

SEARCH_CAL_N:

CMPB    CAL_N,[A_PTR]+  ;COMPARE CAL_N WITH TABLE ENTRY
                JE      SEARCH_RET      ;IF CAL_N FOUND, RETURN
                JLT     SEARCH_CAL_N    ;CONTINUE TIL TABLE ENTRY IS LESS THAN CAL_N
SEARCH_RET:     RET

CAL12_TAB:      DB      2
                DB      1
                DB      0

CAL4589_TAB:    DB      9
                DB      8
                DB      5
                DB      4
                DB      0

ENDIF $PAGE
;***************************************************************************
;SUBROUTINE:    ROTATE_VECT
;       INS:    X_IN,Y_IN,Z_IN
;       OUTS:   X_IN=X_OUT, Y_IN=Y_OUT, Z_IN=Z_OUT
; DESTROYS:     MAT_PTR,VECT_OUT_PTR,ROW_INDEX,COL_INDEX,MUL_RES,SUM_PROD,
;               VECT_IN_PTR
;       CALLS:  MAT_VECT3
; DESCRIPT:
;***************************************************************************
```

```
                ROTATE_VECT:

14364 2E7E      SCALL   MAT_VECT3       ;ROTATE INPUT VECTORS TO BODY AXIS
1436C A0BEE0    LD      X_IN,X_OUT      ;COPY OUTPUT TO INPUT IN ANTICIPATION OF
1436F A0C0E2    LD      Y_IN,Y_OUT      ; ANOTHER ROTATION
14372 A0C2E4    LD      Z_IN,Z_OUT      ;
14375 F0        RET                     ;RETURN FROM ROTATE_VECT

;***********************************************************************
;SUBROUTINE: MATRIX_TO_REGS
;      INS:  SOURCE = POINTER TO MATRIX
;      OUTS: 3X3 MATRIX COPIED AT M11
; DESTROYS: SOURCE, DEST, COUNT,VECT_IN
;    CALLS: COPY
; DESCRIPT:
;***********************************************************************

MATRIX_TO_REGS:

14376 A1AC00CC  LD      DEST,#M11       ;LOAD POINTER TO DESTINATION IN REGISTER SPACE
1437A B109D6    LDB     COUNT,#9        ;COPY 3X3 MATRIX
1437D 2EE2      SCALL   COPY            ;
1437F F0        RET

;***********************************************************************
;SUBROUTINE: ROTATE_TO_LEVEL
;      INS:  X_IN,Y_IN,Z_IN,COMPOSITE ROTATION MATRIX @ COMP_M IN RAM
;      OUTS: X_IN=X_OUT, Y_IN=Y_OUT, Z_IN=Z_OUT
; DESTROYS: SOURCE,DEST,VECT_IN,MAT_PTR,VECT_OUT_PTR,ROW_INDEC,COL_INDEX,
;           MUL_RES,SUM_PROD,VECT_IN_PTR,COUNT
;    CALLS: MATRIX_TO_REGS,ROTATE_VECT
; DESCRIPT: ROTATE INPUTS TO BODY ALIGNMENT ESTABLISHED BY LEVELING PROCEDURE
;***********************************************************************

ROTATE_TO_LEVEL:

;COPY COMPOSITE ROTATION MATRIX TO REGISTER SPACE
14380 A104BCCA  LD      SOURCE,#COMP_M  ;LOAD POINTER TO COMPOSITE MATRIX IN RAM
14384 2FF0      SCALL   MATRIX_TO_REGS  ;

;CALCULATE BODY ALIGNED VECTORS
14386 2FE2      SCALL   ROTATE_VECT     ;ROTATE INPUT VECTORS TO BODY AXIS & COPY
                                        ; OUTPUT TO INPUT IN ANTICIPATION OF
                                        ; ANOTHER ROTATION
14388 F0        RET                     ;RETURN FROM ROTATE_TO_LEVEL $PAGE
;***********************************************************************
;SUBROUTINE: CORRECT_IA
;      INS:  X_IN,Y_IN,Z_IN
;      OUTS: X_IN=X_OUT, Y_IN=Y_OUT, Z_IN=Z_OUT
; DESTROYS: SOURCE,DEST,VECT_IN,MAT_PTR,VECT_OUT_PTR,ROW_INDEC,COL_INDEX,
;           MUL_RES,SUM_PROD,VECT_IN_PTR,COUNT
;    CALLS: MATRIX_TO_REGS, ROTATE_VECT
; DESCRIPT: CORRECT INPUT AXIS MIS_ALIGNMENT
;***********************************************************************
```

```
                CORRECT_IA:
                        ;COPY INPUT AXIS CORRECTION ROTATION MATRIX TO REGISTER SPACE
14389 A1124ACA          LD      SOURCE,#IA_M    ;POINT TO INPUT AXIS CORRECTION MATRIX IN RAM
1438D 2FE7              SCALL   MATRIX_TO_REGS ;

;CALCULATE INSTRUMENT CASE ALIGNED VECTORS
1438F 2FD9              SCALL   ROTATE_VECT     ;ROTATE INPUT VECTORS TO INSTRUMENT CASE
14391 F0                RET                     ;RETURN FROM CORRECT_IA $PAGE
                INCLUDE CALIB.ASC       ;GET CALIBRATION ROUTINES
                ;*************************************************************************
                ;SUBROUTINE: POSITION1
                ;       INS: X_IN,Y_IN,Z_IN
                ;      OUTS: LOCAL_G,COMPOSITE ROTATION MATRIX IN RAM
                ;  DESTROYS: SOURCE,DEST,VECT_IN,MAT_PTR,VECT_OUT_PTR,ROW_INDEC,COL_INDEX,
                ;            MUL_RES,SUM_PROD,TEMP,TEMP1,COUNT,A_PTR,B_PTR,C_PTR,VECT_IN_PTR,
                ;            COUNT,CPL_INDEX
                ;     CALLS: CORRECT_IA,MAG3,CALC_ROLL_PITCH_LEVEL,CALC_ROLL_PITCH_MATRIX,
                ;            COPY,MAT_MAT
                ;  DESCRIPT: CALIBRATION FOR LEVELING IN FIRST POSITION
                ; PROCEDURE:  1. CORRECT SENSOR INPUT AXIS
                ;             2. COMPUTE & STORE LOCAL_G = SQRT(X*X+Y*Y+Z*Z)
                ;             3. COMPUTE & STORE ROLL1 = ARCSIN(X/LOCAL_G)
                ;                               PITCH1 = ARCSIN(Y/LOCAL_G*COS(ROLL1))
                ;             4. COMPUTE & STORE LEVEL MATRIX
                ;             5. COMPUTE & STORE COMPOSITE MATRIX
                ;             6. RETURN
                ;*************************************************************************

POSITION1:      ;CALIBRATION FOR LEVELING IN FIRST POSITION

;PROCESS INPUT OFFSET
14392 EFDD05            LCALL   PROCESS_OFFSET

;CORRECT SENSOR INPUT AXIS RELATIVE TO CASE
14395 2FF2              SCALL   CORRECT_IA

;COMPUTE & STORE LOCAL_GRAV
14397 2861              SCALL   MAG3            ;COMPUTE G

14399 C30116BC          ST      RESULT,LOCAL_GRAV
-439D A4
                                                ;SAVE IN RAM

1439E A0A4CA            LD      LOCAL_G,RESULT  ;PREPARE TO COMPUTE ROLL & PITCH ORIENTATION
143A1 2875              SCALL   CALC_ROLL_PITCH_LEVEL
143A3 C3011BBC          ST      ROLL,ROLL1      ;SAVE ROLL ANGLE IN RAM
-43A7 CC
143A8 C3011ABC          ST      PITCH,PITCH1    ;SAVE PITCH ANGLE IN RAM
-43AC CE

143AD A0CCA0            LD      ARG,ROLL        ;LOAD ROLL ANGLE INPUT
143B0 A0CE84            LD      TEMP,PITCH      ;LOAD PITCH ANGLE INPUT
```

```
;                 CLM:      ;COMPUTE LEVELING MATRIX
14383 2F5F                  SCALL   CALC_PITCH_ROLL_MATRIX
;
;                           ;COPY LEVELING MATRIX TO RAM
14385 A1AC00CA              LD      SOURCE,#M11      ;POINT TO SOURCE
14389 A1F2BECC              LD      DEST,#LEVEL_M    ;POINT TO DESTINATION
1438D B109D6                LDB     COUNT,#9         ;COPY 9 ELEMENTS
143C0 2E9F                  SCALL   COPY
;
;                           ;COMPUTE COMPOSITE MATRIX
143C2 A1124ACA              LD      A_PTR,#IA_M      ;POINT TO IA CORRECTION MATRIX
143C6 A1AC00CE              LD      B_PTR,#M11       ;POINT TO LEVELING MATRIX
143CA A104BCCC              LD      C_PTR,#COMP_M    ;POINT TO DESTINATION
143CE 2E4A                  SCALL   MAT_MAT          ;COMPUTE 3X3 MATRIX
143D0 F0                    RET                      ;COMMON RETURN FROM POSITON1 & POSITION2

;                 $PAGE
;                 ;************************************************************
;                 ;SUBROUTINE: POSITION2
;                 ;     INS: SOURCE,DEST,VECT_IN,MAT_PTR,VECT_OUT_PTR,ROW_INDEX,COL_INDEX,
;                 ;          MUL_RES,SUM_PROD,TEMP,TEMP1,COUNT,VECT_IN_PTR,A_PTR,B_PTR,
;                 ;          C_PTR,CPL_INDEX
;                 ;   CALLS: CORRECT_IA,CALC_ROLL_PITCH_LEVEL,CALC_ROLL_PITCH_MATRIX,COPY
;                 ;    OUTS:
;                 ; DESTROYS:
;                 ;   CALLS: CORRECT_IA,MA63,CALC_ROLL_PITCH_LEVEL,CALC_ROLL_PITCH_MATRIX,
;                 ;          COPY,MAT_MAT
;                 ; DESCRIPT: CALIBRATION FOR LEVELING IN SECOND POSITION
;                 ; PROCEDURE: 1. CORRECT SENSOR INPUT AXIS
;                 ;            2. RETRIEVE G FROM RAM & COMPUTE
;                 ;                 ROLL2 = ARCSIN(X/G)
;                 ;                 PITCH2 = ARCSIN(Y/G*COS(ROLL1))
;                 ;            3. COMPUTE ROLL = (ROLL1+ROLL2)/2
;                 ;                       PITCH2 = (PITCH1+PITCH2)/2
;                 ;            4. COMPUTE & STORE LEVEL MATRIX
;                 ;            5. COMPUTE & STORE COMPOSITE MATRIX
;                 ;            6. RETURN
;                 ;************************************************************
;
;                 POSITION2:   ;CALIBRATION FOR LEVELING IN 2'ND POSITION
;
;                           ;PROCESS INPUT OFFSET
143D1 EF9E05                LCALL   PROCESS_OFFSET
;
;                           ;CORRECT SENSOR INPUT AXIS RELATIVE TO CASE
143D4 2FB3                  SCALL   CORRECT_IA
;
;                           ;RECALL LOCAL_GRAV FROM RAM
143D6 A30116BC              LD      LOCAL_G,LOCAL_GRAV
143DA CA
;
;                           ;COMPUTE ROLL & PITCH ORIENTATION IN POSITION 2
143DB 2B3B                  SCALL   CALC_ROLL_PITCH_LEVEL
;
;                           ;COMPUTE AVERAGE OF ANGLES CALCULATED IN POSITIONS 1 & 2
```

```
I43DD A30118BC      LD      ARG,ROLL1       ;GET ROLL ANGLE AT POSITION 1 FROM RAM
-43E1 A0
I43E2 A3011ABC      LD      TEMP,PITCH1     ;GET PITCH ANGLE AT POSITION 1 FROM RAM
-43E6 84
I
I43E7 64CCA0        ADD     ARG,ROLL        ;AVERAGE ROLL ANGLES
I43EA 0A01A0        SHRA    ARG,#1          ;
I
I43ED 64CE84        ADD     TEMP,PITCH      ;AVERAGE PITCH ANGLES
I43F0 0A0184        SHRA    TEMP,#1         ;
;
I43F3 27BE          SJMP    CLM             ;JUMP TO COMPUTE LEVELING MATRIX
```

```
I               $PAGE
I               ;**************************************************************
I               ;SUBROUTINE: MAG2
I               ;       INS: X_IN,Y_IN
I               ;      OUTS: MAGNITUDE IN RESULT
I               ;  DESTROYS: COUNT,A_PTR,ARG,TEMP
I               ;     CALLS: SQRT
I               ;   DESCRIPT: COMPUTE MAGNITUDE OF X,Y
I               ;**************************************************************

I               MAG2:
I
I43F5 B102D6        LDB     COUNT,#2        ;PROCESS 2 ELEMENTS
I43F8 2003          SJMP    MAGX            ;JUMP TO CONTINUE
I
I               ;**************************************************************
I               ;SUBROUTINE: MAG3
I               ;       INS: X_IN,Y_IN,Z_IN
I               ;      OUTS: MAGNITUDE IN RESULT
I               ;  DESTROYS: COUNT,A_PTR,ARG,TEMP
I               ;     CALLS: SQRT
I               ;   DESCRIPT: COMPUTE MAGNITUDE OF X,Y,Z
I               ;**************************************************************
I
I               MAG3:
;
I43FA B103D6        LDB     COUNT,#3        ;PROCESS 3 ELEMENTS
I43FD A1E000CA MAGX: LD     A_PTR,#X_IN     ;POINT TO THE INPUT VECTOR
I4401 01A0          CLR     ARG             ;CLEAR SUMMATION REGISTERS
I4403 01A2          CLR     ARG+2           ;
I4405 A2CB84 MAG_L: LD      TEMP,[A_PTR]+   ;LOAD ELEMENT
I4408 FE6C8484      MUL     TEMP,TEMP       ;COMPUTE ELEMENT SQUARED
I440C 6484A0        ADD     ARG,TEMP        ;ADD 2 WORDS
I440F A486A2        ADDC    ARG+2,TEMP+2    ;
I4412 E0D6F0        DJNZ    COUNT,MAG_L     ;LOOP TILL DONE
I
I4415 2D04          SCALL   SQRT            ;CALCULATE SQUARE ROOT
I4417 F0            RET                     ;RETURN FROM MAG3
```

```
                $PAGE
I               ;*********************************************************************
I               ;SUBROUTINE:  CALC_ROLL_PITCH_LEVEL
I               ;     INS:   X_IN,Y_IN,LOCAL_G
I               ;     OUTS:  ROLL,PITCH
I               ; DESTROYS:  TEMP,TEMP1,ARG
I               ;     CALLS: ARCSIN,SINCOS
I               ; DESCRIPT:  CALCULATE INSTRUMENT ROLL & PITCH ORIENTATION RE LEVEL
I               ;            ROLL  = ARCSIN (X_IN/LOCAL_G)
I               ;            PITCH = ARCSIN (Y_IN/(LOCAL_G*COS(ROLL)))
I               ;*********************************************************************
I
I               CALC_ROLL_PITCH_LEVEL:
I
I                          ;CALCULATE ROLL ANGLE
14418 A0E0A2               LD     ARG+2,X_IN    ;CALCULATE X_IN/LOCAL_G
14415 01A0                 CLR    ARG           ;
1441D 0E03A0               SHRAL  ARG,#3        ;SCALE INPUT
14420 FE8CCAA0             DIV    ARG,LOCAL_G   ;
14424 2049                 SCALL  ARCSIN        ;CALC ARCSIN
14426 A0BECC               LD     ROLL,A_SIN    ;SAVE ROLL ANGLE
I
I                          ;CALCULATE (LOCAL_G*COS(ROLL)))
14429 A0BEA0               LD     ARG,A_SIN     ;CALCULATE COS(ROLL)
1442C 2D22                 SCALL  SINCOS        ;
1442E FE4CCAC0             MUL    TEMP,COS,LOCAL_G ;CALCULATE (LOCAL_G*COS(ROLL)))
-4432 84
14433 0E0D84               SHRAL  TEMP,#13      ;NORMALIZE
14436 A0E2A2               LD     ARG+2,Y_IN    ;CALCULATE (Y_IN/(LOCAL_G*COS(ROLL)))
14439 01A0                 CLR    ARG           ;
1443B 0E03A0               SHRAL  ARG,#3        ;SCALE INPUT
1443E FE8C84A0             DIV    ARG,TEMP      ;
14442 2D2B                 SCALL  ARCSIN        ;CALCULATE PITCH ANGLE
14444 A0BEDE               LD     PITCH,A_SIN   ;SAVE PITCH ANGLE
14447 F0                   RET                  ;RETURN FROM CALC_ROLL_PITCH_LEVEL

I           $PAGE
I           ;*********************************************************************
I           ;SUBROUTINE:  IDENT_MAT
I           ;     INS:   A_PTR = POINTER TO START OF IDENTITY MATRIX
I           ;     OUTS:  IDENTITY MATRIX & A_PTR
I           ; DESTROYS:  COUNT,A_PTR
I           ;     CALLS: NONE
I           ; DESCRIPT:  GENERATE IDENTITY MATRIX
I           ;*********************************************************************
I
I           IDENT_MAT:
I
14448 B109D6           LDB    COUNT,#9       ;CLEAR 9 CONSECUTIVE WORDS
1444B C2CB00     I_L:  ST     0,[A_PTR]+     ;
1444E E0D6FA           DJNZ   COUNT,I_L      ;
I
14451 A10020D6          LD     COUNT,#2000H  ;LOAD UNITY
14455 C3CAEED6          ST     COUNT,-1[A_PTR]   ;LOAD ELEMENT 1,1
14459 C3CAF6D6          ST     COUNT,-1[A_PTR]   ;LOAD ELEMENT 2,2
1445D C3CAFED6          ST     COUNT,-2[A_PTR]   ;LOAD ELEMENT 3,3
I
14461 F0                RET                  ;RETURN FROM IDENT_MAT
```

```
I               $PAGE
I               ;***********************************************************************
I               ;SUBROUTINE: CALC_IA_M
I               ;    INS:  ARG = ERROR ANGLE (RADIANS)
I               ;    OUTS: IA_M (INPUT AXIS CORRECTION MATRIX)
I               ; DESTROYS: TEMP,TEMP1,SOURCE,DEST,COUNT
I               ;   CALLS: SINCOS,COPY
I               ; DESCRIPT: CALCULATE INPUT AXIS CORRECTION MATRIX
I               ;***********************************************************************
I
I               CALC_IA_M:
I
14462 2CEC              SCALL   SINCOS          ;CALCULATE SINE & COSINE OF ERROR ANGLE
14464 A08EB0            LD      M13,SIN         ;LOAD ELEMENT 1,3
14467 A0C0B4            LD      M22,COS         ;LOAD ELEMENT 2,2
1446A A0C0BC            LD      M33,COS         ;LOAD ELEMENT 3,3
1446D A08EB2            LD      M21,SIN         ;LOAD ELEMENT 2,1
14470 03B2              NEG     M21             ;
I
I                       ;LOAD ELEMENT 1,1
14472 FE4CBCBC          MUL     TEMP,M33,M33    ;CALC COS(ANGLE)*COS(ANGLE)
-4476 84
14477 0E0D84            SHRAL   TEMP,#13        ;NORMALIZE
1447A A084AC            LD      M11,TEMP        ;LOAD
I
I                       ;LOAD ELEMENT 1,2
1447D FE4CBCB0          MUL     TEMP,M13,M33    ;CALC SIN(ANGLE)*COS(ANGLE)
-4481 84
14482 0E0D84            SHRAL   TEMP,#13        ;NORMALIZE
14485 A084AE            LD      M12,TEMP        ;LOAD
I
I                       ;LOAD ELEMENT 3,2
14488 FE4CB0B2          MUL     TEMP,M21,M13    ;CALC -SIN(ANGLE)*SIN(ANGLE)
-448C 84
1448D 0E0D84            SHRAL   TEMP,#13        ;NORMALIZE
14490 A084BA            LD      M32,TEMP        ;LOAD
I
I                       ;LOAD ELEMENT 3,1
14493 A0AEB8            LD      M31,M12         ;COPY SIN(ANGLE)*COS(ANGLE)
14496 03B8              NEG     M31             ;NEGATE
I
I                       ;LOAD ELEMENT 2,3
14498 01B6              CLR     M23             ;LOAD 0
I
I                       ;STORE MATRIX IN RAM
1449A A1AC00CA          LD      SOURCE,#M11     ;POINT TO SOURCE
1449E A1124ACC          LD      DEST,#IA_M      ;POINT TO DESTINATION
144A2 B109D6            LDB     COUNT,#9        ;COPY 9 ELEMENTS
144A5 2DBA              SCALL   COPY
I
144A7 F0                RET                     ;RETURN FROM CALC_IA_M

I               $PAGE
I               ;***********************************************************************
I               ;SUBROUTINE: BIN_TO_TIME
I               ;    INS:  ARG = BINARY TIME INPUT IN TENTHS OF SECONDS
```

```
                        ;          A_PTR = POINTER TO BCD OUTPUT STRING
                        ;    OUTS: 4 BCD DIGITS IN BYTES STARTING @ A-PTR, INCREASINGLY SIGNIFICANT
                        ;          DIGITS AT DECREASING ADDRESSES.  FORMAT M:SS.S
                        ; DESTROYS: ARG,ARG+2,COUNT,A_PTR
                        ;    CALLS: BIN_TO_BCD2
                        ; DESCRIPT: CONVERTS BINARY INPUT IN ARG TO BCD TIME.
                        ;           MAX INPUT VALUE = 5999T = 176FH = 9:59.9
                        ;*************************************************************************

BIN_TO_TIME:

I44A8 280F              SCALL    BIN_TO_BCD2     ;CALCULATE 2 LEAST SIGNIFICANT DIGITS
I44AA 01A2              CLR      ARG+2           ;CLEAR REMAINDER
I44AC BD0600A0          DIVU     ARG,#6          ;DETERMINE TENS OF SECONDS
I44B0 C6CAA2            STB      ARG+2,[A_PTR]   ;STORE TENS OF SECONDS
I44B3 05CA              DEC      A_PTR           ;DECREMENT POINTER
I44B5 C6CAA0            STB      ARG,[A_PTR]     ;STORE MINUTES
I44B8 F0                RET                      ;RETURN FROM BIN_TO_TIME

;*************************************************************************
                ;SUBROUTINE: BIN_TO_BCD2
                ;    INS: ARG = BINARY INPUT
                ;         A_PTR = POINTER TO BCD OUTPUT STRING
                ;    OUTS: 2 BCD DIGITS IN BYTES STARTING @ A-PTR, INCREASINGLY SIGNIFICANT
                ;          DIGITS AT DECREASING ADDRESSES.
                ; DESTROYS: ARG,ARG+2,COUNT,A_PTR
                ;    CALLS: NONE
                ; DESCRIPT: CONVERTS BINARY INPUT IN ARG TO BCD.  MAX INPUT VALUE = 99
                ;*************************************************************************

BIN_TO_BCD2:

I44B9 B102D6            LDB      COUNT,#2        ;CONVERT 2 BCD DIGITS
I44BC 2003              SJMP     CNVL1           ;JUMP TO CONTINUE CONVERSION

;*************************************************************************
                ;SUBROUTINE: BIN_TO_BCD3
                ;    INS: ARG = BINARY INPUT
                ;         A_PTR = POINTER TO BCD OUTPUT STRING
                ;    OUTS: 3 BCD DIGITS IN BYTES STARTING @ A-PTR, INCREASINGLY SIGNIFICANT
                ;          DIGITS AT DECREASING ADDRESSES.
                ; DESTROYS: ARG,ARG+2,COUNT,A_PTR
                ;    CALLS: NONE
                ; DESCRIPT: CONVERTS BINARY INPUT IN ARG TO BCD.  MAX INPUT VALUE = 999
                ;*************************************************************************

BIN_TO_BCD3:

I44BE B103D6            LDB      COUNT,#3        ;CONVERT 3 BCD DIGITS
I44C1 01A2      CNVL1:  CLR      ARG+2           ;CLEAR HIGH WORD OF ARG
I44C3 BD0A00A0          DIVU     ARG,#10         ;DIVIDE INPUT BY DECIMAL 10
I44C7 C6CAA2            STB      ARG+2,[A_PTR]   ;STORE REMAINDER AS BCD DIGIT
I44CA 05CA              DEC      A_PTR           ;DECREMENT POINTER
I44CC E0D6F2            DJNZ     COUNT,CNVL1     ;LOOP TILL DONE
I44CF F0                RET                      ;RETURN FROM BIN_TO_BCD3
```

```
I     ;****************************************************************
I     ;SUBROUTINE: BCD3_TO_BIN
I     ;       INS:  3 BCD DIGITS, INCREASINGLY SIGNIFICANT DIGITS AT DECENDING
I     ;             ADDRESSES.
I     ;             A_PTR = POINTER TO MOST SIGINIFICANT DIGIT
I     ;       OUTS: ARG = BINARY OUTPUT
I     ;   DESTROYS: A_PTR
I     ;      CALLS: NONE
I     ;   DESCRIPT: CONVERTS 3 DIGIT BCD NUMBER TO BINARY. MAX INPUT = 999
I     ;****************************************************************
I
I             BCD3_TO_BIN:
I
14400 B103D6          LDB    COUNT,#3      ;PROCESS 3 BCD DIGITS
14403 01A0            CLR    ARG           ;CLEAR WORKING REGISTER
14405 6D0A00A0 CNVL2: MULU   ARG,#10       ;DECADE MULTIPLY
14409 AECBA2          LDBZE  ARG+2,[A_PTR]+ ;LOAD BCD DIGIT INTO WORD REGISTER
1440C 64A2A0          ADD    ARG,ARG+2     ;ADD BCD DIGIT
1440F E0D6F3          DJNZ   COUNT,CNVL2   ;LOOP TILL DONE
144E2 F0              RET                  ;RETURN FROM BCD3_TO_BIN

I             $PAGE
I     ;****************************************************************
I     ;SUBROUTINE: CLR_AVG
I     ;       INS: NONE
I     ;      OUTS: NONE
I     ;  DESTROYS: A_PTR,COUNT
I     ;     CALLS: NONE
I     ;  DESCRIPT: CLEARS 8-WORD ARRAY IN RAM @ X_AVG, CLEARS AVG_COUNT
I     ;****************************************************************
I
I             CLR_AVG:
I
144E3 B108D6          LDB    COUNT,#8      ;CLEAR 8 WORDS
144E6 A14CBCCA        LD     A_PTR,#X_AVG  ;POINT TO AVERAGING ARRAY
144EA C2CB00  CLRL:   ST     0,[A_PTR]+    ;
144ED E0D6FA          DJNZ   COUNT,CLRL    ;LOOP TIL DONE
144F0 C3015CBC        ST     0,AVG_COUNT   ;CLEAR AVG_COUNT
-44F4 00
144F5 F0              RET                  ;RETURN FROM CLR_AVG
I

I     ;****************************************************************
I     ;SUBROUTINE: ACCUM_AVG
I     ;       INS: NONE
I     ;      OUTS: NONE
I     ;  DESTROYS: A_PTR,B_PTR,TEMP,COUNT  ARG,TEMP,RESULT
I     ;     CALLS: MAG3
I     ;  DESCRIPT: ADD INPUT SAMPLES TO AVERAGE ACCUMULATERS, BUMP AVG_COUNT
I     ;****************************************************************
I
I             ACCUM_AVG:
I
144F6 2F02            SCALL  MAG3          ;COMPUTE MAGNITUDE OF X,Y,Z
144F8 A0A4E6          LD     Z_IN+2,RESULT ;MOVE RESULT TO ARRAY FOR AVERAGING
I
```

```
I44FB 8104D6           LDB    COUNT,#4        ;PROCESS 3 INPUT AXIS & MAG
I44FE A14C8CCA         LD     A_PTR,#X_AVG    ;POINT TO AVERAGING ARRAY
I4502 A1E000CE         LD     B_PTR,#X_IN     ;POINT TO X AXIS
I
I4506 A2CF84   ACCUML: LD     TEMP,[B_PTR]+   ;GET INPUT VECTOR & CONVERT TO A LONG WORD
I4509 0684             EXT    TEMP            ;
I450B 66CA84           ADD    TEMP,[A_PTR]    ;ADD LOW WORD OF ACCUM TO CURRENT SAMPLE
I450E C2CB84           ST     TEMP,[A_PTR]+   ;STORE RESULT
I4511 A6CA86           ADDC   TEMP+2,[A_PTR]  ;ADD HIGH WORD OF ACCUM TO CURRENT SAMPLE
I4514 C2CB86           ST     TEMP+2,[A_PTR]+ ;STORE RESULT
I4517 E0D6EC           DJNZ   COUNT,ACCUML    ;LOOP TILL DONE
I
I451A A3015CBC         LD     TEMP,AVG_COUNT  ;BUMP AVG_COUNT
-451E 84
I451F 0784             INC    TEMP            ;
I4521 C3015CBC         ST     TEMP,AVG_COUNT  ;
-4525 84
I4526 F0               RET                    ;RETURN FROM ACCUM_AVG

I              #PAGE
I              ;*********************************************************************
I              ;SUBROUTINE: CALC_AVG
I              ;     INS:  A_PTR = POINTER TO BOTTOM OF 3 WORD ARRAY FOR DESTINATION
I              ;     OUTS: NONE
I              ; DESTROYS: A_PTR,B_PTR,TEMP,ARG,COUNT
I              ;    CALLS: NONE
I              ; DESCRIPT: CALCULATE AVERAGES AND STORE IN RAM
I              ;*********************************************************************
I
I              CALC_AVG:
I4527 B104D6           LDB    COUNT,#4        ;PROCESS 3 INPUT AXIS & MAG
I452A A14C8CCE         LD     B_PTR,#X_AVG    ;POINT TO AVERAGING ARRAY
I
I452E A2CF84   CALCL:  LD     TEMP,[B_PTR]+   ;GET ACCUMULATER LOW WORD
I4531 A2CF86           LD     TEMP+2,[B_PTR]+ ;GET ACCUMULATER HIGH WORD
I4534 FE8F015C         DIV    TEMP,AVG_COUNT  ;CALCULATE AVERAGE = ACCUM/AVG_COUNT
-4538 8C84
I453A C2CB84           ST     TEMP,[A_PTR]+   ;STORE RESULT
I453D E0D6EE           DJNZ   COUNT,CALCL     ;LOOP TILL DONE
I
I4540 F0               RET                    ;RETURN FROM CALC_AVG
I
I              ;*********************************************************************
I              ;SUBROUTINE: RAD_TO_DEG
I              ;     INS:  A_PTR = POINTER TO BCD OUPTUT STRING (BYTES @ A_PTR, ASCENDING)
I              ;           ARG = INPUT ANGLE GAIN IN RADIANS
I              ;     OUTS: BIN_AG=BINARY ANGLE GAIN
I              ; DESTROYS: A_PTR,ARG
I              ;    CALLS: BIN_TO_BCD3
I              ; DESCRIPT: CONVERTS BINARY RADIAN MEASURE (2**13 = 1 RADIAN) TO BCD
I              ;           (TENS,UNITS,TENTHS).  OUTPUT = (INPUT/2**13)*57.295*10 =
I              ;           = (INPUT/2**16)*57.295*10*8 = (INPUT/2**16)*4583.66
I              ;*********************************************************************
I
I              RAD_TO_DEG:
I
```

```
14541 FE6DE811        MUL     ARG,#4584       ;* CONVERSION FACTOR
-4545 A0
I
I                   ;LOAD INPUT ARG TO BCD3_TO_BIN = PRODUCT/2**16
14546 65008OAO        ADD     ARG,#8000H      ;RND UPPER WORD ACCORDING TO MSB IN LOWER WORD
1454A A400A2          ADDC    ARG+2,0         ;
1454D A0A2A0          LD      ARG,ARG+2       ;SCALE BY 1/2**16
14550 C0F2A0          ST      ARG,BIN_AG      ;STORE BINARY ANGLE GAIN
14553 2F69            SCALL   BIN_TO_BCD3     ;CONVERT TO BCD
14555 F0              RET                     ;RETURN FROM RAD_TO_BCD
I
I        ;************************************************************
I        ;SUBROUTINE:  DEG_TO_RAD
I        ;     INS:   A_PTR = POINTER TO MSD OF BCD INPUT
I        ;     OUTS:  RADIAN RESULT IN ARG
I        ;     DESTROYS:
I        ;     CALLS: BCD3_TO_BIN
I        ;     DESCRIPT: CONVERTS BCD ANGLE MEASURE (TENS,UNITS,TENTHS) TO BINARY
I        ;               RADIAN MEASURE (2**13 = 1 RADIAN).
I        ;               (TENS,UNITS,TENTHS).  OUTPUT = (INPUT/(57.295*10))*2**13 =
I        ;               (INPUT/(57.295*10*8))*2**16 = (INPUT*2**16)/4583.66
I        ;************************************************************
I
I        DEG_TO_RAD:
I
14556 2F78            SCALL   BCD3_TO_BIN     ;CONVERT INPUT TO BINARY
14558 A0A0A2          LD      ARG+2,ARG       ;SCALE * 2**16
1455B 01A0            CLR     ARG             ;
1455D FE8DE811        DIV     ARG,#4584       ;DIVIDE BY CONVERSION FACTOR
-4561 A0
14562 F0              RET                     ;RETURN FROM DEG_TO_RAD
I        ;************************************************************
I        ;SUBROUTINE:  BIN_AG_TO_RAD
I        ;     INS:   BIN_AG
I        ;            A_PTR = POINTER TO DESTINATION
I        ;     OUTS:  RADIAN ANGLE GAIN @ A_PTR
I        ;     DESTROYS: ARG, ARG+2
I        ;     CALLS: NONE
I        ;     DESCRIPT: CONVERT BINARY ANGLE GAIN TO RADIANS & STORE @ A_PTR
I        ;************************************************************
I
I        BIN_AG_TO_RAD:
I
14563 A0F2A2          LD      ARG+2,BIN_AG    ;SCALE * 2**16
14566 01A0            CLR     ARG             ;
14568 FE8DE811        DIV     ARG,#4584       ;DIVIDE BY CONVERSION FACTOR
-456C A0
1456D C2CAA0          ST      ARG,[A_PTR]     ;STORE RESULT @ A_PTR
14570 F0              RET                     ;RETURN FROM BIN_AG_TO_RAD
I
I        ;************************************************************
I        ;SUBROUTINE:  CALC_ANGLE_GAIN
I        ;     INS:   A_PTR = POINTER TO X OR Y (I.E. HORIZONTAL) SLOW AVERAGE
I        ;            B_PTR = POINTER TO Z SLOW AVERAGE
I        ;     OUTS:  OUPTPUT IN ARG
I        ;     DESTROYS: PY,GY,TEMP,TEMP1,ARG,RESULT,A_PTR,B_PTR
I        ;     CALLS: ARCTAN_A_DIV_B,ARCTAN,SQRT
```

```
;       DESCRIPT:
;       PROCEDURE:  1.  COMPUTE A = ARCTAN(SLOW_HORIZONTAL/SLOW_VERTICAL)
;                   1A. COMPUTE ACCELERATION OF GRAVITY FROM LOW SPEED DATA
;                   2.  ADJUST POINTERS TO FAST_HORIZONTAL & FAST_VERTICAL
;                   3.  COMPUTE B = ARCTAN(FAST_HORIZONTAL/FAST_VERTICAL)
;                   4.  COMPUTE B = ABSOLUTE VALUE (B-A)
;                   5.  COMPUTE C = SQRT(FAST_HORIZ**2 +FAST_VERT**2 -LOCAL_GRAV**2)
;                   6.  COMPUTE D = ARCTAN(C)
;                   7.  COMPUTE B = D-B
;                   8.  COMPUTE ANGLE_GAIN = B/C
;
;***************************************************************************

CALC_ANGLE_GAIN:

;               1.  COMPUTE A = ARCTAN(SLOW_HORIZONTAL/SLOW_VERTICAL)
14571 286D           SCALL   ARCTAN_A_DIV_B ;
14573 A0BED2         LD      PY,A_TAN              ;SAVE RESULT

;               1A. COMPUTE ACCELERATION OF GRAVITY FROM LOW SPEED DATA
14576 2CE0           SCALL   VECT_TO_XYZ    ;MOVE SLOW VECTOR TO X_IN
14578 C8CA           PUSH    A_PTR
1457A 2E7E           SCALL   XA63           ;COMPUTE MAGNITUDE
1457C C301608C       ST      RESULT,TEMP_GRAV
-4580 A4

;               2.  ADJUST POINTERS TO FAST_HORIZONTAL & FAST_VERTICAL
;                   ADD     A_PTR,#6       ;
14581 CCCA           POP     A_PTR          ;
14583 650600CE       ADD     B_PTR,#6       ;

;               3.  COMPUTE B = ARCTAN(FAST_HORIZONTAL/FAST_VERTICAL)
14587 2857           SCALL   ARCTAN_A_DIV_B ;

;               4.  COMPUTE B = ABSOLUTE VALUE (B-A)
14589 48D2BED2       SUB     PY,A_TAN;PY    ;
1458D 0602           JGE     POS_B          ;JUMP IF B IS POSITIVE
1458F 03D2           NEG     PY             ;ELSE, CONVERT NEGATIVE RESULT TO POSITIVE
        POS_B:

;               5.  COMPUTE C = SQRT(FAST_HORIZ**2 +FAST_VERT**2 -LOCAL_GRAV**2)
14591 A2CAA0         LD      ARG,[A_PTR]    ;CALC FAST_HORIZ**2
14594 FE6CA0A0       MUL     ARG,ARG        ;

14598 A2CEB4         LD      TEMP,[B_PTR]   ;CALC FAST_VERT**2
1459B FE6C8484       MUL     TEMP,TEMP      ;

1459F 6484A0         ADD     ARG,TEMP       ;SUM OF SQUARES
145A2 A486A2         ADDC    ARG+2,TEMP+2   ;

145A5 A301608C       LD      TEMP,TEMP_GRAV ;CALC TEMP_GRAV**2
-45A9 84
145AA FE6C8484       MUL     TEMP,TEMP      ;

145AE 6884A0         SUB     ARG,TEMP       ;DIFFERENCE OF SQUARES
145B1 A886A2         SUBC    ARG+2,TEMP+2   ;
```

```
I
I45B4 DE27              JLT     RT0             ;ABORT IF DIFFERENCE IS NEGATIVE, ELSE
I
I45B6 EF62FB            LCALL   SQRT            ;CALC SQUARE ROOT
I
I45B9 FE4D0020          MUL     ARG,RESULT,#2000H    ;CONVERT TO RADIAN MEASURE
-45BD A4A0
I45BF FE8F0160          DIV     ARG,TEMP_GRAV   ;DIVIDE-BY LOCAL GRAVITY
-45C3 BCA0
I45C5 A0A0D4            LD      QY,ARG          ;SAVE RESULT
I
I                 ;     6. COMPUTE D = ARCTAN(C)
I45C8 EFBCFB            LCALL   ARCTAN          ;
I
I                 ;     7. COMPUTE B = D-B  & SCALE TO PREP FOR DIVISION
I45CB 48BED2A2          SUB     ARG+2,PY,A_TAN  ;
I45CF 01A0              CLR     ARG             ;
I45D1 0E03A0            SHRAL   ARG,#3          ;
I
I45D4 DE07              JLT     RT0             ;ABORT IF DIFFERENCE IS NEGATIVE, ELSE
I
I                 ;     8. COMPUTE ANGLE_GAIN = B/C
I45D6 FE8CD4A0          DIV     ARG,QY          ;
I
I45DA DE01              JLT     RT0             ;ABORT IF RESULT IS NEGATIVE, ELSE
I
I45DC F0                RET                     ;RETURN FROM ANGLE_GAIN
I
I             RT0:      ;RETURN ARG = 0
I45DD 01A0              CLR     ARG
I45DF F0                RET                     ;RETURN FROM ANGLE_GAIN

I               $PAGE
I       ;***************************************************************
I       ;SUBROUTINE: ARCTAN_A_DIV_B
I       ;      INS:  A_PTR = POINTER TO INPUT A
I       ;            B_PTR = POINTER TO INPUT B
I       ;      OUTS: OUTPUT WORD IN A_TAN
I       ; DESTROYS: ARG,TEMP,TEMP1
I       ;    CALLS: ARCTAN
I       ; DESCRIPT:
I       ;***************************************************************
I
I       ARCTAN_A_DIV_B:
I
I45E0 A2CAA2            LD      ARG+2,[A_PTR]   ;GET INPUT A & SCALE TO PREP FOR DIVISION
I45E3 01A0              CLR     ARG             ;
I45E5 0E03A0            SHRAL   ARG,#3          ;
I45E8 FE8ECEA0          DIV     ARG,[B_PTR]     ;
I45EC EF98FB            LCALL   ARCTAN          ;COMPUTE ARCTANGENT
I45EF F0                RET                     ;RETURN FORM ARCTAN_A_DIV_B
I
I       ;        END                             ;END OF ROTATE.ASC

CAL_TABLE:      ;TABLE OF CALIBRATE PROCEDURE VECTORS
```

```
45F0 5546              DW      CAL1
45F2 7046              DW      CAL2
45F4 A546              DW      CAL3
45F6 0C47              DW      CAL7

MP_STRT_CAL:

45F8 51FD80A0          AND9    MP_TEMP,MODE_SW,#11111101B
                                                    ;TEST FOR ILLEGAL KEYS

45FC D722              JNE     STP_SET             ;IF ILLEGAL KEYS, JUMP TO SET STOP MODE

45FE 31801F            JBC     MODE_SW,1,STP_SET   ;IF CAL BUTTON NOT ACTIVE, SET STOP

4601 E08126            DJNZ    MP_SME_C,MP_STRT_CAL_RET
                                                    ;ELSE-DECREMENT SAME BUTTON COUNTER

MP_STRT_CAL1:
4604 A113467A          LD      MODE_TASK,#MP_CAL   ;ON 0, SET MODE TO MP_CAL, ELSE RETURN
4608 EFD5FA            LCALL   PNTR_COLLAPSE       ;SINGLE IMAGE
460B EFD8FA            LCALL   CLEAR_ALL           ;CLEAR ENTIRE DISPLAY
460E B101F6            LDB     CAL_N,#1            ;INITIALIZE THE CALIBRATE PROCEDURE = 1

4611 2022              SJMP    CAL_N_OK            ;DETERMINE NEW CAL MODE, AND BRANCH TO
                                                    ; SELECTED CAL MODE.

4613 3A800A   MP_CAL:  JBS     MODE_SW,2,STP_SET   ;IF STOP KEY IS ACTIVE, JUMP

4616 B30157B8          LDB     MP_TEMP,SWR         ;JUMP IF DISPLAY_SELECT KEY IS ACTIVE
-461A A0
461B 3CA00D            JBS     MP_TEMP,4,DIS_SEL_ACT
461E 2020              SJMP    SR_CAL              ;ELSE, BRANCH TO CAL TASK

STP_SET:                             ;SET MODE = STOP
4620 EFC3FA            LCALL   CLEAR_ALL
4623 EFBDFA            LCALL   PNTR_EXPAND
4626 A1F8407A          LD      MODE_TASK,#MP_STOP

462A F0       MP_STRT_CAL_RET:    RET

DIS_SEL_ACT:                         ;DISPLAY SELECT KEY ACTIVE.

462B 17F6              INCB    CAL_N               ;INCREMENT CAL_N, RANGE 1-4.
462D 9904F6            CMPB    CAL_N,#4            ;PERFORM COMPARISON
4630 DA03              JLE     CAL_N_OK            ;JUMP IF CAL_N WITHIN LEGAL RANGE

4632 E7C6FA            LJMP    MP_START_SCALE      ;JUMP BACK TO SCALING CALIBRATION
                                                    ; ROUTINE.
              CAL_N_OK:

4635 ACF6F0            LDBZE   CAL_MODE,CAL_N      ;GET CAL_N
4638 64F0F0            ADD     CAL_MODE,CAL_MODE   ;CAL_N *2 SINCE VECTORS ARE WORDS

463B A3F1EE45          LD      CAL_MODE,CAL_TABLE-2[CAL_MODE]
```

```
-463F F0
                                                    ;TABLE LABEL -2 SINCE CAL_N
                                                    ;  STARTS AT 1.

4640 E3F0       BR_CAL:   BR      [CAL_MODE]    ;JUMP TO MODE-DEPENDENT PROCESSING

CAL_DONE:
    4642 A158486C             LD      ICON_P,#ICON_DONE1
    4646 EF8F01               LCALL   LOAD_ICON_DMI1_DEST
    4649 A16E496C             LD      ICON_P,#ICON_DONE2
    464D EF8801               LCALL   LOAD_ICON_DMI1_DEST

4650 A15446F0             LD      CAL_MODE,#CAL_IDLE
    4654 F0         CAL_IDLE: RET                   ;RETURN FROM CAL_DONE $PAGE
                    ;************************
                    ; ROUTINE: CAL1                ;LEVEL POSITION 1
                    ;************************
                    CAL1:
    4655 A1FE486C             LD      ICON_P,#ICON_LEVEL1
    4659 EF7C01               LCALL   LOAD_ICON_DMI1_DEST
    465C A118496C             LD      ICON_P,#ICON_CAR1
    4660 EF7501               LCALL   LOAD_ICON_DMI1_DEST
    4663 A11E486C             LD      ICON_P,#ICON_OK?1
    4667 EF6E01               LCALL   LOAD_ICON_DMI1_DEST
    466A A13B486C             LD      ICON_P,#ICON_OK?2
    466E EF6701               LCALL   LOAD_ICON_DMI1_DEST
    4671 A17546F0             LD      CAL_MODE,#CAL1_1
    4675 338004     CAL1_1:   JBC     MODE_SW,3,CAL1_RET  ;IF REC-N KEY INACTIVE, JMP TO RETURN
    4678 2D18                 SCALL   POSITION1            ;ELSE, EXECUTE POSITION 1 LEVELING 467A 27C6                 SJMP    CAL_DONE

467C F0         CAL1_RET: RET                          ;RETURN FROM CAL1

;************************
                    ; ROUTINE: CAL2                ;LEVEL POSITION 2
                    ;************************
                    CAL2:
    467D A138496C             LD      ICON_P,#ICON_LEVEL2
    4681 EF5401               LCALL   LOAD_ICON_DMI1_DEST
    4684 A155496C             LD      ICON_P,#ICON_CAR2
    4688 EF4D01               LCALL   LOAD_ICON_DMI1_DEST
    468B A11E486C             LD      ICON_P,#ICON_OK?1
    468F EF4601               LCALL   LOAD_ICON_DMI1_DEST
    4692 A13B486C             LD      ICON_P,#ICON_OK?2
    4696 EF3F01               LCALL   LOAD_ICON_DMI1_DEST

4699 A19D46F0             LD      CAL_MODE,#CAL2_1

469D 338004     CAL2_1:   JBC     MODE_SW,3,CAL2_RET  ;IF REC-N KEY INACTIVE, JMP TO RETURN
    46A0 2D2F                 SCALL   POSITION2            ;ELSE, EXECUTE POSITION 2 LEVELING

46A2 279E                 SJMP    CAL_DONE            ;
```

```
46A4 F0      CAL2_RET:   RET                         ;RETURN FROM CAL1

$PAGE
             ;************************
             ; ROUTINE: CAL3                          ;ROLL GAIN
             ;************************
             CAL3:                                    ;MANUAL EDITING OF ROLL_GAIN
46A5 EF41FA              LCALL   CLEAR_DMI1           ;CLEAR THE DOT MATRIX IMAGES.
46A8 A184486C            LD      ICON_P,#ICON_ROLL
46AC EF2901              LCALL   LOAD_ICON_DMI1_DEST
46AF A1A1486C            LD      ICON_P,#ICON_DEGq1
46B3 EF2201              LCALL   LOAD_ICON_DMI1_DEST
46B6 A11E486C            LD      ICON_P,#ICON_OK?1
46BA EF1B01              LCALL   LOAD_ICON_DMI1_DEST
46BD A13B486C            LD      ICON_P,#ICON_OK?2
46C1 EF1401              LCALL   LOAD_ICON_DMI1_DEST
46C4 A1C1486C            LD      ICON_P,#ICON_DEGq2
46C8 EF24FA              LCALL   LOAD_ICON_DMI1       ;'OR' THIS ICON IN NON DESTRUCTIVELY.
46CB 28AD                SCALL   DISP_ROLL_GAIN       ;DISPLAY ROLL_GAIN FROM RAM.

46CD B1FFFB              LDB     KEY_TIME,#-1         ;SET KEY_TIME INACTIVE
46D0 A1D446F0            LD      CAL_MODE,#CAL3_1     ;POINT TO NEXT CAL TASK

CAL3_1:                                  ;ROLL_GAIN EDITING IN PROGRESS

46D4 3F8008              JBS     MODE_SW,7,ADV        ;IF FF ACTIVE, JUMP TO ADVANCE
                                                     ;  ANGLE_GAIN.

46D7 3C8014              JBS     MODE_SW,4,RTD        ;IF REW ACTIVE, JUMP TO REDUCE
                                                     ;  ANGLE_GAIN.

46DA B1FFF8              LDB     KEY_TIME,#-1         ;ELSE, SET KEYTIME INACTIVE
46DD 201C                SJMP    TC3_REC              ;JUMP TO TEST RECORD BUTTON

ADV:                                     ;ADVANCE_ANGLE_GAIN BRANCH
46DF 15F8                DECB    KEY_TIME             ;PROCESS KEY_TIME TO TEST FOR AUTO
                                                     ;  INCREMENT.
46E1 D218                JGT     TC3_REC              ;IF KEY_TIME >0, JUMP TO TEST RECORD
                                                     ;  BUTTON.
46E3 DF03                JE      AUTO_INC             ;IF 0, JUMP TO LOAD TIMER FOR AUTO
                                                     ;  ADVANCE.
46E5 B109F8              LDB     KEY_TIME,#INT_1-1    ;ELSE, LOAD TIMER WITH INITIAL INTERVAL

AUTO_INC:
46E8 17F8                INCB    KEY_TIME             ;BUMP TIMER TO CONTINE INC AT 10/SEC

46EA 28A1                SCALL   INC_ANGLE_GAIN       ;INCREMENT DISPLAYED ANGLE_GAIN
46EC 200D                SJMP    TC3_REC              ;JUMP TO TEST RECORD BUTTON

RTD:                                     ;REDUCE ANGLE_GAIN BRANCH
46EE 15F8                DECB    KEY_TIME             ;PROCESS KEY_TIME TO TEST FOR AUTO
                                                     ;  INCREMENT.
46F0 D209                JGT     TC3_REC              ;IF KEY_TIME >0, JUMP TO TEST RECORD
                                                     ;  BUTTON.
46F2 DF03                JE      AUTO_DEC             ;IF 0, JUMP TO LOAD TIMER FOR AUTO
                                                     ;  ADVANCE.
46F4 B109F8              LDB     KEY_TIME,#INT_1-1    ;ELSE, LOAD TIMER WITH INITIAL INTERVAL
```

```
                AUTO_DEC:
46F7 17F8       INCB    KEY_TIME            ;BUMP TIMER TO CONTINE DEC AT 10/SEC
46F9 289C       SCALL   DEC_ANGLE_GAIN      ;DECREMENT DISPLAYED ANGLE_GAIN.

TC3_REC:                    ;TEST RECORD BUTTON
46FB 33800D     JBC     MODE_SW,3,C3RET     ;IF RECORD KEY INACTIVE, JUMP TO RETURN

;ELSE, STORE DISPLAYED ANGLE_GAIN
46FE C30126BC   ST      BIN_AG,BIN_ROLL_GAIN ;STORE BINARY ROLL GAIN
-4702 F2

IF 0                        ;STORE BCD_ROLL_GAIN
                LDBZE   ARG,BIN_AG          ;LOAD INPUT TO CONVERSION ROUTINE
                LD      A_PTR,#BCD_ROLL_GAIN+2 ;POINT TO RAM FOR DESTINATION
                SCALL   BIN_TO_BCD3
                ENDIF

4703 A11C9CCA   LD      A_PTR,#ROLL_GAIN    ;POINT TO DESTINATION
4707 2E5A       SCALL   BIN_AG_TO_RAD       ;CONVERT BINARY ROLL GAIN TO RADIANS
4709 2737       SJMP    CAL_DONE

470B F0    C3RET: RET                       ;RETURN FROM CAL3

$PAGE
                ;****************
                ; ROUTINE: CAL7                  ;PITCH GAIN
                ;****************
                CAL7:                       ;MANUAL EDITING OF PITCH_GAIN
                                            ;DISPLAY PITCH_GAIN FROM RAM
470C EFDAF9     LCALL   CLEAR_DMI1          ;CLEAR THE DOT MATRIX IMAGE.
470F A1E1486C   LD      ICON_P,#ICON_PITCH
4713 EFC200     LCALL   LOAD_ICON_DMI1_DEST
4716 A1A1486C   LD      ICON_P,#ICON_DEGg1
471A EFB900     LCALL   LOAD_ICON_DMI1_DEST
471D A11E486C   LD      ICON_P,#ICON_OK?1
4721 EFB400     LCALL   LOAD_ICON_DMI1_DEST
4724 A13B486C   LD      ICON_P,#ICON_OK?2
4728 EFAD00     LCALL   LOAD_ICON_DMI1_DEST
472B A1C1486C   LD      ICON_P,#ICON_DEGg2
472F EFBDF9     LCALL   LOAD_ICON_DMI1      ;'OR' IN THIS ICON NON DESTRUCTIVELY.

4732 283F       SCALL   DISP_PITCH_GAIN

4734 B1FFF8     LDB     KEY_TIME,#-1        ;SET KEY_TIME INACTIVE
4737 A13847F0   LD      CAL_MODE,#CAL7_1    ;POINT TO NEXT CAL TASK

CAL7_1:                     ;PITCH_GAIN EDITING IN PROGRESS
473B 3F8008     JBS     MODE_SW,7,ADV1      ;IF FF ACTIVE, JUMP TO ADVANCE
                                            ;  ANGLE_GAIN.

473E 3C8014     JBS     MODE_SW,4,RTD1      ;IF REW ACTIVE, JUMP TO REDUCE
                                            ;  ANGLE_GAIN.

4741 B1FFF8     LDB     KEY_TIME,#-1        ;ELSE, SET KEYTIME INACTIVE
4744 201C       SJMP    TC7_REC             ;JUMP TO TEST RECORD BUTTON
```

```
              ADV1:                              ;ADVANCE ANGLE GAIN BRANCH
4746 15F8           DECB    KEY_TIME             ;PROCESS KEY_TIME TO TEST FOR AUTO
                                                 ;  INCREMENT.
4748 D218           JGT     TC7_REC              ;IF KEY_TIME >0, JUMP TO TEST RECORD
                                                 ;  BUTTON.
474A DF03           JE      AUTO_INC1            ;IF 0, JUMP TO LOAD TIMER FOR AUTO
                                                 ;  ADVANCE.
474C B109F8         LDB     KEY_TIME,#INT_1-1    ;ELSE, LOAD TIMER WITH INITIAL INTERVAL 474F 17F8   AUTO_INC1:  INCB    KEY_TIME         ;BUMP TIMER TO CONTINE INC AT 10/SEC

;INCREMENT DISPLAYED ANGLE_GAIN
4751 283A           SCALL   INC_ANGLE_GAIN 4753 200D           SJMP    TC7_REC              ;JUMP TO TEST RECORD BUTTON

RTD1:                              ;REDUCE ANGLE_GAIN BRANCH
4755 15F8           DECB    KEY_TIME             ;PROCESS KEY_TIME TO TEST FOR AUTO
                                                 ;  INCREMENT.
4757 D209           JGT     TC7_REC              ;IF KEY_TIME >0, JUMP TO TEST RECORD
                                                 ;  BUTTON.
4759 DF03           JE      AUTO_DEC1            ;IF 0, JUMP TO LOAD TIMER FOR AUTO
                                                 ;  ADVANCE.
475B B109F8         LDB     KEY_TIME,#INT_1-1    ;ELSE, LOAD TIMER WITH INITIAL INTERVAL 475E 17F8   AUTO_DEC1:  INCB    KEY_TIME         ;BUMP TIMER TO CONTINE DEC AT 10/SEC
4760 2835           SCALL   DEC_ANGLE_GAIN       ;DECREMENT DISPLAYED ANGLE_GAIN

TC7_REC:                           ;TEST RECORD BUTTON
4762 338000         JBC     MODE_SW,3,C7RET      ;IF RECORD KEY INACTIVE, JUMP TO RETURN

;ELSE, STORE DISPLAYED ANGLE_GAIN
4765 C30128BC       ST      BIN_AG,BIN_PITCH_GAIN ;STORE BINARY PITCH GAIN
-4769 F2

IF 0                         ;STORE BCD_PITCH_GAIN
                    LDBZE   AR6,BIN_AG           ;LOAD INPUT TO CONVERSION ROUTINE
                    LD      A_PTR,#BCD_PITCH_GAIN+2 ;POINT TO RAM FOR DESTINATION
                    SCALL   BIN_TO_BCD3
                    ENDIF

476A A11E8CCA       LD      A_PTR,#PITCH_GAIN    ;POINT TO DESTINATION
476E 2DF3           SCALL   BIN_AG_TO_RAD        ;CONVERT BINARY ROLL GAIN TO RADIANS 4770 26D0           SJMP    CAL_DONE

4772 F0     C7RET:  RET                          ;RETURN FROM CAL7

$PAGE
;********************************************************************
;SUBROUTINE: DISP_PITCH_GAIN
;      INS: NONE
;      OUTS:
; DESTROYS:
;    CALLS:
; DESCRIPT:
;********************************************************************
```

DISP_PITCH_GAIN:

```
4773 A30128BC        LD      BIN_AG,BIN_PITCH_GAIN   ;LOAD BINARY ROLL GAIN
-4777 F2
4778 2025            SJMP    CRE
```

```
;****************************************************************
;SUBROUTINE: DISP_ROLL_GAIN
;    INS:   NONE
;    OUTS:
; DESTROYS:
;    CALLS:
; DESCRIPT:
;****************************************************************
```

DISP_ROLL_GAIN:

```
477A A30126BC        LD      BIN_AG,BIN_ROLL_GAIN    ;LOAD BINARY ROLL GAIN
-477E F2
477F 201E            SJMP    CRE
```

```
;****************************************************************
;SUBROUTINE: DISP_ANGLE_GAIN
;    INS:   SOURCE = POINTER TO BCD ANGLE GAIN IN RAM
;    OUTS:
; DESTROYS:
;    CALLS: CLEAR_SSI1
; DESCRIPT: COPIES 3 BCD-BYTES TO DISPLAY IMAGE
;****************************************************************
```

DISP_ANGLE_GAIN:

```
4781 B103D6          LDB     COUNT,#3                ;COPY 3 BYTES
4784 A1B800CD        LD      DEST,#SS_T-2            ;POINT TO IMAGE
4788 EFE0FA          LCALL   COPYB
478B 2027            SJMP    LOAD_ANGLE_GAIN         ;RETURN FROM LOAD_ANGLE_GAIN
```

```
;****************************************************************
;SUBROUTINE: INC_ANGLE_GAIN
;    INS:   BIN_AG
;    OUTS:
; DESTROYS:
;    CALLS:
; DESCRIPT:
;****************************************************************
```

INC_ANGLE_GAIN:

```
478D 899600F2        CMP     BIN_AG,#U_BOUND         ;COMPARE WITH UPPER BOUND
4791 D60C            JGE     CRE                     ;JUMP IF CURRENT VALUE .GE. BOUND
4793 07F2            INC     BIN_AG                  ;ELSE, INCREMENT BIN_AG 4795 2008            SJMP    CRE                     ;JUMP TO CONVERT REVISED ESTIMATE TO
                                                     ; BCD.
```

```
;****************************************************************
;SUBROUTINE: DEC_ANGLE_GAIN
;     INS: BIN_AG
;    OUTS:
; DESTROYS:
;   CALLS:
; DESCRIPT:
;****************************************************************

DEC_ANGLE_GAIN:

4797 89CEFFF2       CMP     BIN_AG,#L_BOUND      ;COMPARE WITH LOWER BOUND
479B DA02           JLE     CRE                  ;JUMP IF CURRENT VALUE .LE. BOUND
479D 05F2           DEC     BIN_AG               ;ELSE, DECREMENT BIN_AG

CRE:      ;CONVERT REVISED ESTIMATE TO BCD 479F 281A           SCALL   CLEAR_SS_BCD         ;CLEAR 7-SEGMENT BCD ARRAY

47A1 A0F2A0         LD      ARG,BIN_AG           ;LOAD INPUT TO CONVERSION ROUTINE
47A4 8800A0         CMP     ARG,0                ;DETERMINE FLAGS
47A7 D605           JGE     ABSV                 ;JUMP IF MAGNITUDE IS POSITIVE

47A9 03A0           NEG     ARG                  ;CONVERT NEGATIVE INPUT TO POSITIVE
47AB B114B7         LDB     SS_T-3,#MINUS_CODE   ;LOAD "-" IN 7-SEGMENT DISPLAY

47AE A1BA00CA ABSV: LD      A_PTR,#SS_T          ;POINT TO DISPLAY IMAGE FOR DESTINATION
47B2 2D0A           SCALL   BIN_TO_BCD3

;****************************************************************
;SUBROUTINE: LOAD_ANGLE_GAIN
;     INS:
;    OUTS:
; DESTROYS:
;   CALLS:
; DESCRIPT:
;****************************************************************

LOAD_ANGLE_GAIN:

47B4 B1025B         LDB     SS_DC,#00000010B
47B7 EF3EFF         LCALL   LOAD_SSI1
47BA F0             RET                          ;RETURN FROM LOAD_ANGLE_GAIN

;****************************************************************
;SUBROUTINE: CLEAR_SS_BCD
;     INS:
;    OUTS:
; DESTROYS:
;   CALLS:
; DESCRIPT: CLEAR BCD STAGING ARRAY
;****************************************************************

CLEAR_SS_BCD:

47BB B107D6         LDB     COUNT,#7             ;LOAD 7 BYTES
47BE A0B4CA         LDBZE   A_PTR,#SS_G-2        ;POINT TO BCD ARRAY
```

```
47C1 B10AD4            LDB     VECT_IN,#BLANK_CODE
47C4 C6C3D4    CLRSSL: STB     VECT_IN,[A_PTR]+
47C7 E0D6FA            DJNZ    COUNT,CLRSSL
47CA F0                RET                             ;RETURN FROM CLEAR_SS_BCD

I              INCLUDE ICONS.ASC
I
I              ;**********************************************************
I              ;SUBROUTINE: LOAD_ICON_DEST
I              ;    INS:
I              ;    OUTS:  ICON_P
I              ;  DESTROYS: ICON_P, PNTR_T, PNTR_T1, PNTR_S, PNTR_S1, TEMP2, LCNT
I              ;    CALLS:
I              ;  DESCRIPT: LOADS AN ICON DESTRICTIVELY INTO THE PHASE A AND PHASE B
I              ;            OF THE CURRENTLY SELECTED IMAGE.
I              ;**********************************************************
I              LOAD_ICON_DEST:
I              LIDE_SELBNK:                            ;SELECT THE BANK IN WHICH TO WRITE THE
I                                                      ;  ICON.
147CB 375A0A           JBC     D_CNTRL,7,LIDE_1_FIL    ;IF BANK 1 IS BEING WRITTEN INTO JUMP
I                                                      ;  AHEAD TO SET UP THE POINTERS TO
I                                                      ;  OPERATE ON BANK 1.
I              LIDE_2_FIL:                             ;ELSE-SET POINTERS FOR BANK 2.
147CE A1C0B98A         LD      PNTR_T,#DMI2A
147D2 A130BA8E         LD      PNTR_T1,#DMI2B
147D6 2008             SJMP    LIDE_SB_DNE
I
I              LOAD_ICON_DMI1_DEST:
I
I              LIDE_1_FIL:                             ;SET POINTERS FOR BANK 1.
147D8 A170B88A         LD      PNTR_T,#DMI1A
147DC A1E0B88E         LD      PNTR_T1,#DMI1B
I
I              LIDE_SB_DNE:                            ;DONE WITH BANK SELECTION.
I
I
I              LIDE_FILL:                              ;FILL THE SELECTED DOT MATRIX IMAGE
I                                                      ;  WITH ICON.
147E0 AE6D84           LDBZE   TEMP2,[ICON_P]+         ;LOAD THE BYTE OFFSET INTO THE IMAGE
I                                                      ;  TO BEGIN LOADING THIS ICON AND STEP
I                                                      ;  THE POINTER TO POINT TO THE NUMBER
I                                                      ;  OF BYTES TO WRITE.
147E3 AE6D86           LDBZE   LCNT,[ICON_P]+          ;LOAD THE NUMBER OF BYTES IN THE ICON.
I
147E6 64848A           ADD     PNTR_T,TEMP2            ;CREATE THE STARTING ADDRESS OF THE
I                                                      ;  FIRST BYTE OF THE ICON FOR BOTH
147E9 64848E           ADD     PNTR_T1,TEMP2           ;  PHASE A AND PHASE B IMAGES.
I
I              LIDE_L:                                 ;LOOP HERE FOR NEXT ICON BYTE.
147EC B26D84           LDB     TEMP2,[ICON_P]+         ;LOAD CURRENT ICON BYTE INTO A
I                                                      ;  TEMPORARY REGISTER AND STEP THE
I                                                      ;  ICON POINTER TO THE NEXT ICON BYTE.
I
147EF C68A84           STB     TEMP2,[PNTR_T]          ;WRITE THIS BYTE INTO THE PHASE A
I                                                      ;  IMAGE.
```

```
I47F2 C68E84        STB     TEMP2,[PNTR_T1]         ;WRITE THIS BYTE INTO THE PHASE B
                                                    ;  IMAGE.
I47F5 6504008A      ADD     PNTR_T,#4               ;STEP TO THE NEXT ADJACENT TARGET BYTE
I47F9 6504008E      ADD     PNTR_T1,#4              ;  IN BOTH PHASE A AND PHASE B IMAGES.

I47FD E086EC        DJNZ    LCNT,LIDE_L             ;DECREMENT THE ICON BYTE COUNTER AND
                                                    ;  IF NOT ZERO JUMP BACK TO WRITE THE
                                                    ;  NEXT ICON BYTE.
            LIDE_DNE:                               ;ELSE-RETURN
I4800 F0            RET

ICON_1:
I4801 00            DB 0                ;OFFSET
I4802 1B            DB 27               ;BYTES IN THIS ICON
I4803 00            DB 00000000B
I4804 00            DB 00000000B
I4805 00            DB 00000000B
I4806 00            DB 00000000B
I4807 00            DB 00000000B
I4808 00            DB 00000000B
I4809 00            DB 00000000B
I480A 00            DB 00000000B
I480B 00            DB 00000000B
I480C 00            DB 00000000B       ;
I480D 00            DB 00000000B
I480E 00            DB 00000000B
I480F 00            DB 00000000B
I4810 00            DB 00000000B
I4811 00            DB 00000000B
I4812 00            DB 00000000B
I4813 00            DB 00000000B
I4814 00            DB 00000000B
I4815 00            DB 00000000B
I4816 00            DB 00000000B       ;
I4817 00            DB 00000000B
I4818 00            DB 00000000B
I4819 00            DB 00000000B
I481A 00            DB 00000000B
I481B 00            DB 00000000B
I481C 00            DB 00000000B
I481D 00            DB 00000000B

ICON_OK?1:
I481E 02            DB 2                ;OFFSET
I481F 1B            DB 27               ;NUMBER OF BYTES
I4820 E0            DB 11100000B
I4821 10            DB 00010000B
I4822 10            DB 00010000B
I4823 E0            DB 11100000B
I4824 00            DB 00000000B
I4825 F0            DB 11110000B
I4826 80            DB 10000000B
I4827 40            DB 01000000B
I4828 30            DB 00110000B
I4829 00            DB 00000000B       ;
I482A 00            DB 00000000B
```

```
I482B 20              DB 00100000B
I482C 10              DB 00010000B
I482D 10              DB 00010000B
I482E 90              DB 10010000B
I482F 60              DB 01100000B
I4830 00              DB 00000000B
I4831 00              DB 00000000B
I4832 00              DB 00000000B
I4833 00              DB 00000000B   ;
I4834 00              DB 00000000B
I4835 00              DB 00000000B
I4836 00              DB 00000000B
I4837 00              DB 00000000B
I4838 00              DB 00000000B
I4839 00              DB 00000000B
I483A 00              DB 00000000B
;
;
;           ICON_OK?2:
I483B 03              DB 3            ;OFFSET
I483C 1A              DB 26           ;NUMBER OF BYTES
I483D 03              DB 00000011B
I483E 04              DB 00000100B
I483F 04              DB 00000100B
I4840 03              DB 00000011B
I4841 00              DB 00000000B
I4842 07              DB 00000111B
I4843 00              DB 00000000B
I4844 01              DB 00000001B
I4845 06              DB 00000110B
I4846 00              DB 00000000B   ;
I4847 00              DB 00000000B
I4848 00              DB 00000000B
I4849 00              DB 00000000B
I484A 05              DB 00000101B
I484B 00              DB 00000000B
I484C 00              DB 00000000B
I484D 00              DB 00000000B
I484E 00              DB 00000000B
I484F 00              DB 00000000B
I4850 00              DB 00000000B   ;
I4851 00              DB 00000000B
I4852 00              DB 00000000B
I4853 00              DB 00000000B
I4854 00              DB 00000000B
I4855 00              DB 00000000B
I4856 00              DB 00000000B
I4857 00              DB 00000000B
;
;
;
;           ICON_DONE1:
I4858 02              DB 2            ;OFFSET
I4859 14              DB 20           ;BYTES IN THIS ICON
I485A F0              DB 11110000B
I485B 10              DB 00010000B
```

```
I485C 10            DB 00010000B
I485D E0            DB 11100000B
I485E 00            DB 00000000B
I485F E0            DB 11100000B
I4860 10            DB 00010000B
I4861 10            DB 00010000B
I4862 E0            DB 11100000B
I4863 00            DB 00000000B    ;
I4864 F0            DB 11110000B
I4865 40            DB 01000000B
I4866 80            DB 10000000B
I4867 00            DB 00000000B
I4868 F0            DB 11110000B
I4869 00            DB 00000000B
I486A F0            DB 11110000B
I486B 90            DB 10010000B
I486C 90            DB 10010000B
I486D 10            DB 00010000B    ;
;
;
;       ICON_DONE2:
I486E 03            DB 3            ;OFFSET
I486F 14            DB 20           ;BYTES IN THIS ICON
I4870 07            DB 00000111B
I4871 04            DB 00000100B
I4872 04            DB 00000100B
I4873 03            DB 00000011B
I4874 00            DB 00000000B
I4875 03            DB 00000011B
I4876 04            DB 00000100B
I4877 04            DB 00000100B
I4878 03            DB 00000011B
I4879 00            DB 00000000B    ;
I487A 07            DB 00000111B
I487B 00            DB 00000000B
I487C 00            DB 00000000B
I487D 01            DB 00000001B
I487E 07            DB 00000111B
I487F 00            DB 00000000B
I4880 07            DB 00000111B
I4881 04            DB 00000100B
I4882 04            DB 00000100B
I4883 04            DB 00000100B    ;
;
;
;       ICON_ROLL:
I4884 00            DB 0            ;OFFSET
I4885 1B            DB 27           ;BYTES IN THIS ICON
I4886 FE            DB 11111110B
I4887 32            DB 00110010B
I4888 52            DB 01010010B
I4889 8C            DB 10001100B
I488A 00            DB 00000000B
I488B 7C            DB 01111100B
I488C 82            DB 10000010B
I488D 82            DB 10000010B
I488E 7C            DB 01111100B
```

```
I488F 00            DB 00000000B    ;
I4890 FE            DB 11111110B
I4891 80            DB 10000000B
I4892 80            DB 10000000B
I4893 80            DB 10000000B
I4894 00            DB 00000000B
I4895 FE            DB 11111110B
I4896 80            DB 10000000B
I4897 80            DB 10000000B
I4898 80            DB 10000000B
I4899 00            DB 00000000B    ;
I489A 00            DB 00000000B
I489B 00            DB 00000000B
I489C 00            DB 00000000B
I489D 00            DB 00000000B
I489E 00            DB 00000000B
I489F 00            DB 00000000B
I48A0 00            DB 00000000B
;
;
;        ICON_DE6g1:
I48A1 01            DB 1            ;OFFSET
I48A2 1B            DB 27           ;BYTES IN THIS ICON
I48A3 FE            DB 11111110B
I48A4 82            DB 10000010B
I48A5 82            DB 10000010B
I48A6 7C            DB 01111100B
I48A7 00            DB 00000000B
I48A8 FE            DB 11111110B
I48A9 92            DB 10010010B
I48AA 92            DB 10010010B
I48AB 82            DB 10000010B
I48AC 00            DB 00000000B    ;
I48AD 7C            DB 01111100B
I48AE 82            DB 10000010B
I48AF 92            DB 10010010B
I48B0 74            DB 01110100B
I48B1 00            DB 00000000B
I48B2 C0            DB 11000000B
I48B3 60            DB 01100000B
I48B4 30            DB 00110000B
I48B5 18            DB 00011000B
I48B6 0C            DB 00001100B    ;
I48B7 00            DB 00000000B
I48B8 60            DB 01100000B
I48B9 90            DB 10010000B
I48BA 90            DB 10010000B
I48BB F0            DB 11110000B
I48BC 00            DB 00000000B
I48BD 00            DB 00000000B
I48BE 00            DB 00000000B
I48BF 00            DB 00000000B
I48C0 00            DB 00000000B
;
;
;        ICON_DE6g2:                ;BOTTOM PART OF g.
I48C1 02            DB 2            ;OFFSET
```

```
148C2 1B           DB 27           ;BYTES IN THIS ICON
148C3 00           DB 00000000B
148C4 00           DB 00000000B
148C5 00           DB 00000000B
148C6 00           DB 00000000B
148C7 00           DB 00000000B
148C8 00           DB 00000000B
148C9 00           DB 00000000B
148CA 00           DB 00000000B
148CB 00           DB 00000000B
148CC 00           DB 00000000B    ;
148CD 00           DB 00000000B
148CE 00           DB 00000000B
148CF 00           DB 00000000B
148D0 00           DB 00000000B
148D1 00           DB 00000000B
148D2 00           DB 00000000B
148D3 00           DB 00000000B
148D4 00           DB 00000000B
148D5 00           DB 00000000B
148D6 00           DB 00000000B    ;
148D7 00           DB 00000000B
148D8 00           DB 00000000B
148D9 04           DB 00000100B
148DA 04           DB 00000100B
148DB 03           DB 00000011B
148DC 00           DB 00000000B
148DD 00           DB 00000000B
148DE 00           DB 00000000B
148DF 00           DB 00000000B
148E0 00           DB 00000000B
;
;
;          ICON_PITCH:
148E1 00           DB 0            ;OFFSET
148E2 1B           DB 27           ;BYTES IN THIS ICON
148E3 FE           DB 11111110B
148E4 12           DB 00010010B
148E5 12           DB 00010010B
148E6 0C           DB 00001100B
148E7 00           DB 00000000B
148E8 82           DB 10000010B
148E9 FE           DB 11111110B
148EA 82           DB 10000010B
148EB 00           DB 00000000B
148EC 02           DB 00000010B    ;
148ED 02           DB 00000010B
148EE FE           DB 11111110B
148EF 02           DB 00000010B
148F0 02           DB 00000010B
148F1 00           DB 00000000B
148F2 7C           DB 01111100B
148F3 82           DB 10000010B
148F4 82           DB 10000010B
148F5 44           DB 01000100B
148F6 00           DB 00000000B    ;
148F7 FE           DB 11111110B
```

```
I48F8 10            DB 00010000B
I48F9 10            DB 00010000B
I48FA FE            DB 11111110B
I48FB 00            DB 00000000B
I48FC 00            DB 00000000B
I48FD 00            DB 00000000B
;
;
;           ICON_LEVEL1:
I48FE 00            DB 0              ;OFFSET
I48FF 1B            DB 27             ;BYTES IN THIS ICON
I4900 7F            DB 01111111B
I4901 40            DB 01000000B
I4902 40            DB 01000000B
I4903 00            DB 00000000B
I4904 7F            DB 01111111B
I4905 49            DB 01001001B
I4906 41            DB 01000001B
I4907 00            DB 00000000B
I4908 0F            DB 00001111B
I4909 30            DB 00110000B      ;
I490A 40            DB 01000000B
I490B 30            DB 00110000B
I490C 0F            DB 00001111B
I490D 00            DB 00000000B
I490E 7F            DB 01111111B
I490F 49            DB 01001001B
I4910 41            DB 01000001B
I4911 00            DB 00000000B
I4912 7F            DB 01111111B
I4913 40            DB 01000000B      ;
I4914 40            DB 01000000B
I4915 00            DB 00000000B
I4916 00            DB 00000000B
I4917 00            DB 00000000B
I4918 42            DB 01000010B
I4919 7F            DB 01111111B
I491A 40            DB 01000000B
;
;           ICON_CAR1:
I491B 01            DB 1              ;OFFSET
I491C 1B            DB 27             ;BYTES IN THIS ICON
I491D 30            DB 00110000B
I491E 78            DB 01111000B
I491F 7C            DB 01111100B
I4920 7E            DB 01111110B
I4921 FE            DB 11111110B
I4922 FF            DB 11111111B
I4923 FF            DB 11111111B
I4924 F9            DB 11111001B
I4925 79            DB 01111001B
I4926 79            DB 01111001B      ;
I4927 7B            DB 01111011B
I4928 7A            DB 01111010B
I4929 7E            DB 01111110B
I492A 7C            DB 01111100B
I492B 7C            DB 01111100B
```

```
1492C 78             DB 01111000B
1492D 78             DB 01111000B
1492E F8             DB 11111000B
1492F F8             DB 11111000B
14930 F8             DB 11111000B  ;
14931 F8             DB 11111000B
14932 70             DB 01110000B
14933 70             DB 01110000B
14934 70             DB 01110000B
14935 20             DB 00100000B
14936 80             DB 10000000B
14937 FF             DB 11111111B
;
;
;          ICON_LEVEL2:
14938 00             DB 0           ;OFFSET
14939 1B             DB 27          ;BYTES IN THIS ICON
1493A 7F             DB 01111111B
1493B 40             DB 01000000B
1493C 40             DB 01000000B
1493D 00             DB 00000000B
1493E 7F             DB 01111111B
1493F 49             DB 01001001B
14940 41             DB 01000001B
14941 00             DB 00000000B
14942 0F             DB 00001111B
14943 30             DB 00110000B  ;
14944 40             DB 01000000B
14945 30             DB 00110000B
14946 0F             DB 00001111B
14947 00             DB 00000000B
14948 7F             DB 01111111B
14949 49             DB 01001001B
1494A 41             DB 01000001B
1494B 00             DB 00000000B
1494C 7F             DB 01111111B
1494D 40             DB 01000000B  ;
1494E 40             DB 01000000B
1494F 00             DB 00000000B
14950 00             DB 00000000B
14951 72             DB 01110010B
14952 49             DB 01001001B
14953 49             DB 01001001B
14954 46             DB 01000110B
;
;
;          ICON_CAR2:
14955 01             DB 1           ;OFFSET
14956 1B             DB 27          ;BYTES IN THIS ICON
14957 20             DB 00100000B
14958 70             DB 01110000B
14959 70             DB 01110000B
1495A 70             DB 01110000B
1495B F8             DB 11111000B
1495C F8             DB 11111000B
1495D F8             DB 11111000B
1495E F8             DB 11111000B  ;
```

```
I495F 78            DB 01111000B
I4960 78            DB 01111000B
I4961 7C            DB 01111100B
I4962 7C            DB 01111100B
I4963 7E            DB 01111110B
I4964 7A            DB 01111010B
I4965 7B            DB 01111011B
I4966 79            DB 01111001B
I4967 79            DB 01111001B
I4968 F9            DB 11111001B  ;
I4969 FF            DB 11111111B
I496A FF            DB 11111111B
I496B FE            DB 11111110B
I496C 7E            DB 01111110B
I496D 7C            DB 01111100B
I496E 78            DB 01111000B
I496F 30            DB 00110000B
I4970 80            DB 10000000B
I4971 FF            DB 11111111B

;*************************************************************************
;SUBROUTINE: PROCESS_OFFSET
;       INS:  NONE
;      OUTS:
;  DESTROYS:
;     CALLS:
;   DESCRIPT:

;*************************************************************************

OFF8 =      FSP     EQU     00FF8H    ;FULL SCALE PLUS
F000 =      FSM     EQU     0F000H    ;FULL SCALE MINUS

;FORMAT OF CLIP_FLGS:    B0-POSITIVE CLIP X_IN
            ;                        B1-NEGATIVE CLIP X_IN
            ;                        B2-POSITIVE CLIP Y_IN
            ;                        B3-NEGATIVE CLIP Y_IN

PROCESS_OFFSET:

4972 0184            CLR     TEMP            ;CLEAR TEMPORARY FLAGS REGISTER
4974 89F80FE0        CMP     X_IN,#FSP       ;COMPARE X_IN WITH POSITIVE FULL-SCALE
4978 D703            JNE     P01             ;JUMP IF NOT IN POSITIVE CLIPPING
497A 910184          ORB     TEMP,#1         ;ELSE, SET BIT 0
        P01:
497D 8900F0E0        CMP     X_IN,#FSM       ;COMPARE X_IN WITH MINUS FULL-SCALE
4981 D703            JNE     P02             ;JUMP IF NOT IN NEGATIVE CLIPPING
4983 910284          ORB     TEMP,#2         ;ELSE, SET BIT 1
        P02:
4986 89F80FE2        CMP     Y_IN,#FSP       ;COMPARE Y_IN WITH POSITIVE FULL-SCALE
498A D703            JNE     P03             ;JUMP IF NOT IN POSITIVE CLIPPING
498C 910484          ORB     TEMP,#4         ;ELSE, SET BIT 2
        P03:
498F 8900F0E2        CMP     Y_IN,#FSM       ;COMPARE Y_IN WITH MINUS FULL-SCALE
4993 D703            JNE     P04             ;JUMP IF NOT IN NEGATIVE CLIPPING
4995 910884          ORB     TEMP,#8         ;ELSE, SET BIT 3
```

PO4:

```
4998 C70122BC      STB     TEMP,OVF_FLG    ;STORE CLIPPING FLAGS
-499C 84

499D 6B0120BC      SUB     X_IN,OFFSET     ;SUBTRACT OFFSET FROM ACCELEROMETER INPUTS
-49A1 E0
49A2 6B0120BC      SUB     Y_IN,OFFSET     ;
-49A6 E2
49A7 6B0120BC      SUB     Z_IN,OFFSET     ;
-49AB E4

49AC F0            RET                     ;RETURN FROM PROCESS_OFFSET
```

```
;********************************************************************
;SUBROUTINE: OUT_CLIP
;     INS: NONE
;    OUTS:
; DESTROYS:
;   CALLS:
; DESCRIPT:
;********************************************************************
```

OUT_CLIP:

```
49AD B30122BC      LDB     TEMP,OVF_FLG    ;GET CLIPPING FLAGS
-49B1 E4
49B2 308404        JBC     TEMP,0,OC1      ;JUMP IF BIT 0 CLEAR
49B5 A1FF00BE      LD      X_OUT,#00FFH    ;ELSE, SET X_OUT = FULL SCALE POSITIVE
             OC1:
49B9 318404        JBC     TEMP,1,OC2      ;JUMP IF BIT 1 CLEAR
49BC A100FFBE      LD      X_OUT,#0FF00H   ;ELSE, SET X_OUT = FULL SCALE NEGATIVE
             OC2:
49C0 328404        JBC     TEMP,2,OC3      ;JUMP IF BIT 2 CLEAR
49C3 A1FF00C0      LD      Y_OUT,#00FFH    ;ELSE, SET Y_OUT = FULL SCALE POSITIVE
             OC3:
49C7 338404        JBC     TEMP,3,OC4      ;JUMP IF BIT 3 CLEAR
49CA A100FFC0      LD      Y_OUT,#0FF00H   ;ELSE, SET Y_OUT = FULL SCALE NEGATIVE
             OC4:
49CE F0            RET                     ;RETURN FROM OUT_CLIP
```

```
;********************************************************************
;SUBROUTINE: ROT_MEM_INIT
;     INS: NONE
;    OUTS:
; DESTROYS:
;   CALLS:
; DESCRIPT: INITIALIZE ROTATION MEMORY PARAMETERS TO DEFAULT VALUES
;********************************************************************
```

ROT_MEM_INIT:

```
                                           ;DIGITIZE INPUT AXIS ERROR CHANNEL &
                                           ; SCALE APPROPRIATELY.
             IF 0
             CLR     ARG                   ;INPUT ERROR = 0 FOR NOW
```

```
                    LCALL   CALC_IA_M               ;CALCULATE INPUT AXIS ERROR
                    ENDIF                           ;  CORRECTION MATRIX.

49CF A1F2BBCA       LD      A_PTR,#LEVEL_M          ;SET LEVELING MATRIX = [I]
49D3 EF72FA         LCALL   IDENT_MAT               ;LOAD IDENTITY MATRIX

;SET COMPOSITE ROTATION MATRIX = IA_M
49D6 A1124ACA       LD      SOURCE,#IA_M            ;POINT TO SOURCE
49DA A104BCCC       LD      DEST,#COMP_M            ;POINT TO DESTINATION
49DE B109D6         LDB     COUNT,#9                ;COPY 9 WORDS
49E1 EF7DFB         LCALL   COPY                    ;COPY INPUT CORRECTION MATRIX TO COMPOSITE

49E4 A1163CCA       LD      A_PTR,#LOCAL_GRAV
49E8 B149D6         LDB     COUNT,#(KEY_FLAG-LOCAL_GRAV)
49EB C6CB00  MEM_IL: STB    0,[A_PTR]+
49EE E0D6FA         DJNZ    COUNT,MEM_IL

49F1 A14100F2       LD      BIN_AG,#ROLL_INIT       ;SET DEFAULT ROLL GAIN
49F5 C30128BC       ST      BIN_AG,BIN_ROLL_GAIN    ;
-49F9 F2
49FA A11CECCA       LD      A_PTR,#ROLL_GAIN        ;POINT TO RADIAN ROLL GAIN
49FE EF62FB         LCALL   BIN_AG_TO_RAD           ;CONVERT TO RADIANS & STORE
4A02 A11500F2       LD      BIN_AG,#PITCH_INIT      ;SET DEFAULT PITCH GAIN
4A05 C30128BC       ST      BIN_AG,BIN_PITCH_GAIN   ;
-4A09 F2
4A0A A11EBCCA       LD      A_PTR,#PITCH_GAIN       ;POINT TO RADIAN PITCH GAIN
4A0E EF52FB         LCALL   BIN_AG_TO_RAD           ;CONVERT TO RADIANS & STORE

4A11 F0             RET

IA_M:   ;INPUT AXES CORRECTION MATRIX. SEE ANALYSIS OF 11-11-86

;   ;IDENTITY MATRIX
                ;   DW      2000H,0,0
                ;   DW      0,2000H,0
                ;   DW      0,0,2000H

;INPUT AXIX ERROR ANGLE = 3.1 DEGREES.
4A12 F41F BB01      DW      8180,443,0
4A16 0000
4A18 45FE F41F      DW      -443,8180,0
4A1C 0000
4A1E 45FE 1800      DW      -443,24,8204
4A22 0C20

;*****************************************************************************
;SUBROUTINE: ROT_PWR_UP
;    INS:
;    OUTS:
; DESTROYS:
;    CALLS:
; DESCRIPT:
;*****************************************************************************

ROT_PWR_UP:

;DIGITIZE & STORE OFFSET CHANNEL
```

```
4A24 B10302        LDB      AD_CMD,#1011B         ;READ OFFSET ON A/D CHANNEL 3

4A27 FD            NOP                            ;WAIT 2 STATES FOR CAM PROCESSING
4A28 FD            NOP                            ;

4A29 3B02FD        JBS      AD_LO,3,$             ;WAIT TIL CONVERSION DONE

4A2C B00284        LDB      TEMP,AD_LO            ;GET RESULT
4A2F B00385        LDB      TEMP+1,AD_HI          ;

4A32 71C084        ANDB     TEMP,#0C0H            ;RETAIN 10 MSD'S

4A35 9580B5        XORB     TEMP+1,#80H           ;COMPLEMENT MSB TO CONVERT TO 2'S COMP

4A38 0A0384        SHRA     TEMP,#3               ;SCALE

4A3B C301208C      ST       TEMP,OFFSET           ;STORE OFFSET
-4A3F 84
4A40 F0            RET                            ;RETURN FROM ROT_PWR_UP

PROCESS_SAMPLE_TRIAD1:

4A41 A0E0BE        LD       X_OUT,X_IN            ;LOAD X INPUT
4A44 0A04BE        SHRA     X_OUT,#4              ;SCALE TO GARY'S FORMAT
4A47 A0E2C0        LD       Y_OUT,Y_IN            ;LOAD Y INPUT
4A4A 0A04C0        SHRA     Y_OUT,#4              ;SCALE TO GARY'S FORMAT

4A4D FD            NOP

4A4E EF24F8        LCALL    PROCESS_SAMPLE_TRIAD

4A51 FD            NOP
4A52 FD            NOP
4A53 FD            NOP                            ;LD    LDLVL_X_VAL,X_OUT

4A54 F0            RET

0000               END
```

| ;%T Symbol Name | Type Value |     | Symbol Name | Type Value |
|---|---|---|---|---|
| ABSV. . . . . . . . . . . . . . . . | L 47AE | | ANG_GT. . . . . . . . . . . . . . | L 41B4 |
| ACCUML. . . . . . . . . . . . . . | L 4506 | | ANG_LT. . . . . . . . . . . . . . | L 4196 |
| ACCUM_AVG . . . . . . . . . . . | L 44F6 | | ARCSIN. . . . . . . . . . . . . . | L 416F |
| ADV . . . . . . . . . . . . . . . . | L 460F | | ARCTAN. . . . . . . . . . . . . . | L 41E7 |
| ADV1. . . . . . . . . . . . . . . . | L 4748 | | ARCTAN_A_DIV_B. . . . . . . . | L 45E0 |
| AD_CH0. . . . . . . . . . . . . . | I 00E0 | | ARG . . . . . . . . . . . . . . . . | I 00A0 |
| AD_CH1. . . . . . . . . . . . . . | I 00E2 | | AUTO_DEC. . . . . . . . . . . . | L 46F7 |
| AD_CH2. . . . . . . . . . . . . . | I 00E4 | | AUTO_DEC1 . . . . . . . . . . . | L 475E |
| AD_CH3. . . . . . . . . . . . . . | I 00E6 | | AUTO_INC. . . . . . . . . . . . | L 46E9 |
| AD_CH4. . . . . . . . . . . . . . | I 00E8 | | AUTO_INC1 . . . . . . . . . . . | L 474F |
| AD_CH5. . . . . . . . . . . . . . | I 00EA | | AVERAGE . . . . . . . . . . . . | L 4304 |
| AD_CMD. . . . . . . . . . . . . . | I 0002 | | AVG_COUNT . . . . . . . . . . | L BC5C |
| AD_HI . . . . . . . . . . . . . . | I 0003 | | AYL . . . . . . . . . . . . . . . . | L 00A0 |
| AD_LO . . . . . . . . . . . . . . | I 0002 | | A_PTR . . . . . . . . . . . . . . | I 00CA |
| | | | A_SIN . . . . . . . . . . . . . . | I 00BE |
| | | | A_TAN . . . . . . . . . . . . . . | I 00BE |

| | |
|---|---|
| BAUD_RATE | I 000E |
| BCD3_TO_BIN | L 44D0 |
| BIN_AG | I 00F2 |
| BIN_AG_TO_RAD | L 4563 |
| BIN_PITCH_GAIN | L BC28 |
| BIN_ROLL_GAIN | L BC26 |
| BIN_TO_BCD2 | L 44B9 |
| BIN_TO_BCD3 | L 44BE |
| BIN_TO_TIME | L 44A8 |
| BLANK_CODE | I 000A |
| BR_CAL | L 4640 |
| BYL | L 00A4 |
| B_PTR | I 00CE |
| C3RET | L 470B |
| C7RET | L 4772 |
| CAL1 | L 4655 |
| CAL1_1 | L 4675 |
| CAL1_RET | L 467C |
| CAL2 | L 467D |
| CAL2_1 | L 469D |
| CAL2_RET | L 46A4 |
| CAL3 | L 46A5 |
| CAL3_1 | L 46D4 |
| CAL7 | L 470C |
| CAL7_1 | L 473B |
| CALCL | L 452E |
| CALC_ANGLE_GAIN | L 4571 |
| CALC_AVG | L 4527 |
| CALC_IA_M | L 4462 |
| CALC_PITCH_ROLL_MATRIX | L 4314 |
| CALC_ROLL_PITCH_LEVEL | L 4418 |
| CAL_DONE | L 4642 |
| CAL_IDLE | L 4654 |
| CAL_MODE | I 00F0 |
| CAL_N | I 00F6 |
| CAL_N_OK | L 4635 |
| CAL_TABLE | L 45F0 |
| CHAN_NUM | L BC62 |
| CLEAR_ALL | I 40E6 |
| CLEAR_DIG | I 40F2 |
| CLEAR_DMI1 | I 40E9 |
| CLEAR_SSI1 | I 40EC |
| CLEAR_SS_BCD | L 47BB |
| CLIP_HI | L 42F6 |
| CLIP_LO | L 42FC |
| CLM | L 43B3 |
| CLRL | L 44EA |
| CLRSSL | L 47C4 |
| CLR_AVG | L 44E3 |
| CNVL1 | L 44C1 |
| CNVL2 | L 44D5 |
| COL1 | L 4220 |
| COL_INDEX | I 00D0 |
| COMP_M | L BC04 |
| COPY | L 4261 |
| COPYB | L 426B |
| COPYB_L | L 426B |
| COPY_L | L 4261 |
| CORRECT_IA | L 4389 |
| COS | I 00C0 |
| COUNT | I 00D6 |
| COWL | L 4200 |
| CPL | L 4227 |
| CPL_INDEX | I 00D6 |
| CRE | L 479F |
| CYL | L 00A6 |
| C_PTR | I 00CC |
| DEC_ANGLE_GAIN | L 4797 |
| DEG_TO_RAD | L 4556 |
| DEST | I 00CC |
| DISP_ANGLE_GAIN | L 4781 |
| DISP_PITCH_GAIN | L 4773 |
| DISP_ROLL_GAIN | L 477A |
| DIS_SEL_ACT | L 462B |
| DMI1A | I B870 |
| DMI1B | I B8E0 |
| DMI2A | I B9C0 |
| DMI2B | I BA30 |
| DONE | L 414F |
| DUMP_PTR | L BC64 |
| DY | L 00BE |
| D_CNTRL | I 005A |
| EY | L 00C0 |
| FILLER | L BC24 |
| FSM | I F000 |
| FSP | I 0FF8 |
| FY | L 00C2 |
| GY | L 00C4 |
| HSI_MODE | I 0003 |
| HSI_STATUS | I 0006 |
| HSI_TIME | I 0004 |
| HSO_CMD | I 0006 |
| HSO_REG | I 0014 |
| HSO_TIME | I 0004 |
| HY | L 00C6 |
| IA_M | L 4A12 |
| ICON_1 | L 4801 |
| ICON_CAR1 | L 491B |
| ICON_CAR2 | L 4955 |
| ICON_DEG1 | L 48A1 |
| ICON_DEG2 | L 48C1 |
| ICON_DONE1 | L 4858 |
| ICON_DONE2 | L 486E |
| ICON_LEVEL1 | L 48FE |
| ICON_LEVEL2 | L 4938 |
| ICON_OK?1 | L 481E |
| ICON_OK?2 | L 483B |
| ICON_P | I 006C |
| ICON_PITCH | L 48E1 |
| ICON_ROLL | L 4884 |
| IDENT_MAT | L 444B |
| INC_ANGLE_GAIN | L 478D |

| | |
|---|---|
| INT_1 | I 000A |
| INT_MASK | I 0008 |
| INT_N | I 0003 |
| INT_PENDING | I 0009 |
| INVTAN | L 41D2 |
| IOC0 | I 0015 |
| IOC1 | I 0016 |
| IOPORT0 | I 000E |
| IOPORT1 | I 000F |
| IOPORT2 | I 0010 |
| IOS0 | I 0015 |
| IOS1 | I 0016 |
| IOS2 | I 0017 |
| IY | L 00C8 |
| I_L | L 444B |
| JY | L 00CA |
| KEY_FLAG | L BC5F |
| KEY_TIME | I 00F8 |
| KEY_TIMER | L BC5E |
| KY | L 00CC |
| L | I 0086 |
| LEVEL_M | L BBF2 |
| LIDE_1_FIL | L 47D8 |
| LIDE_2_FIL | L 47CE |
| LIDE_DNE | L 4800 |
| LIDE_FILL | L 47E0 |
| LIDE_L | L 47EC |
| LIDE_SB_DNE | L 47E0 |
| LIDE_SELBNK | L 47CB |
| LOAD_ANGLE_GAIN | L 47B4 |
| LOAD_ICON_DEST | L 47CB |
| LOAD_ICON_DMI1 | I 40EF |
| LOAD_ICON_DMI1_DEST | L 47D8 |
| LOAD_SSI1 | I 40F5 |
| LOCAL_G | I 00CA |
| LOCAL_GRAV | L BC16 |
| LOOP | L 4135 |
| LY | L 00CE |
| L_BOUND | I FFCE |
| M11 | L 00AC |
| M12 | L 00AE |
| M13 | L 00B0 |
| M21 | L 00B2 |
| M22 | L 00B4 |
| M23 | L 00B6 |
| M31 | L 00B8 |
| M32 | L 00BA |
| M33 | L 00BC |
| MAG2 | L 43F5 |
| MAG3 | L 43FA |
| MAGX | L 43F0 |
| MAG_AVG | L BC58 |
| MAG_L | L 4405 |
| MAG_X_Y | L 435B |
| MATRIX_TO_REGS | L 4376 |
| MAT_MAT | L 421A |
| MAT_PTR | I 00CE |
| MAT_VECT3 | L 41EA |
| MEM_IL | L 49EB |
| MINUS_CODE | I 0014 |
| MODE_SW | I 0080 |
| MODE_TASK | I 007A |
| MP_CAL | L 4613 |
| MP_SME_C | I 0081 |
| MP_START_SCALE | I 40FB |
| MP_STOP | I 40F8 |
| MP_STRT_CAL | L 45F8 |
| MP_STRT_CAL1 | L 4604 |
| MP_STRT_CAL_RET | L 462A |
| MP_TEMP | I 00A0 |
| MUL_RES | I 00A0 |
| NY | L 00D0 |
| OC1 | L 49B9 |
| OC2 | L 49C0 |
| OC3 | L 49C7 |
| OC4 | L 49CE |
| OFFSET | L BC20 |
| OLD_IA_M | L BBE0 |
| OUT_CLIP | L 49AD |
| OVF_FLG | L BC22 |
| PITCH | I 00CE |
| PITCH1 | I BC1A |
| PITCH_GAIN | L BC1E |
| PITCH_INIT | I 0015 |
| PITCH_MAG_FAST | L BC4A |
| PITCH_MAG_SLOW | L BC42 |
| PITCH_X_FAST | L BC44 |
| PITCH_X_SLOW | L BC3C |
| PITCH_Y_FAST | L BC46 |
| PITCH_Y_SLOW | L BC3E |
| PITCH_Z_FAST | L BC48 |
| PITCH_Z_SLOW | L BC40 |
| PI_OVR_4 | I 1922 |
| PNTR_COLLAPSE | I 40E0 |
| PNTR_EXPAND | I 40E3 |
| PNTR_S | I 0088 |
| PNTR_S1 | I 008C |
| PNTR_T | I 008A |
| PNTR_T1 | I 008E |
| P01 | L 497D |
| P02 | L 4986 |
| P03 | L 498F |
| P04 | L 4998 |
| POSITION1 | L 4392 |
| POSITION2 | L 43D1 |
| POS_B | L 4591 |
| PROCESS_OFFSET | L 4972 |
| PROCESS_SAMPLE_TRIAD | L 4275 |
| PROCESS_SAMPLE_TRIAD1 | L 4A41 |
| PWM_CONTROL | I 0017 |
| PY | L 00D2 |
| QY | L 00D4 |
| R0 | I 0000 |
| RAD_TO_DEG | L 4541 |

```
RESULT. . . . . . . . . . . . . . . I 00A4
ROLL. . . . . . . . . . . . . . . . I 00CC
ROLL1 . . . . . . . . . . . . . . . L BC18
ROLL_GAIN . . . . . . . . . . . . . L BC1C
ROLL_INIT . . . . . . . . . . . . . I 0041
ROLL_MAG_FAST . . . . . . . . . . . L BC3A
ROLL_MAG_SLOW . . . . . . . . . . . L BC32
ROLL_X_FAST . . . . . . . . . . . . L BC34
ROLL_X_SLOW . . . . . . . . . . . . L BC2C
ROLL_Y_FAST . . . . . . . . . . . . L BC36
ROLL_Y_SLOW . . . . . . . . . . . . L BC2E
ROLL_Z_FAST . . . . . . . . . . . . L BC38
ROLL_Z_SLOW . . . . . . . . . . . . L BC30
ROTATE_TO_LEVEL . . . . . . . . . . L 4380
ROTATE_VECT . . . . . . . . . . . . L 436A
ROT_MEM_INIT. . . . . . . . . . . . L 49CF
ROT_WR_UP . . . . . . . . . . . . . L 4A24
ROWL. . . . . . . . . . . . . . . . L 41F5
ROWL1 . . . . . . . . . . . . . . . L 421D
ROW_INDEX . . . . . . . . . . . . . I 00D2
RT0 . . . . . . . . . . . . . . . . L 45DD
RTD . . . . . . . . . . . . . . . . L 46EE
RTD1. . . . . . . . . . . . . . . . L 4755
RUN_T . . . . . . . . . . . . . . . I 00F4
RY. . . . . . . . . . . . . . . . . L 00D6
SBUF. . . . . . . . . . . . . . . . I 0007
SCALE_CLIP. . . . . . . . . . . . . L 42DF
SIN . . . . . . . . . . . . . . . . I 00BE
SINCOS. . . . . . . . . . . . . . . L 4150
SOURCE. . . . . . . . . . . . . . . I 00CA
SP. . . . . . . . . . . . . . . . . I 0018
SP_CON. . . . . . . . . . . . . . . I 0011
SORT. . . . . . . . . . . . . . . . L 411B
SS_DC . . . . . . . . . . . . . . . I 008B
SS_G. . . . . . . . . . . . . . . . I 00B6
SS_T. . . . . . . . . . . . . . . . I 00BA
STP_SET . . . . . . . . . . . . . . L 4620
ST_OUT. . . . . . . . . . . . . . . L 4300
SUM_PROD. . . . . . . . . . . . . . I 00A4
SWR . . . . . . . . . . . . . . . . I 8857
TAN_PI_OVR_8. . . . . . . . . . . . I 0D41
TC3_REC . . . . . . . . . . . . . . L 46FB
TC7_REC . . . . . . . . . . . . . . L 4762
TEMP. . . . . . . . . . . . . . . . I 0084
TEMP1 . . . . . . . . . . . . . . . I 00A4
TEMP2 . . . . . . . . . . . . . . . I 0084
TEMP3 . . . . . . . . . . . . . . . I 00A8
TEMP_GRAV . . . . . . . . . . . . . L BC60
TEMP_RAD_A6 . . . . . . . . . . . . L BC2A
TIMER1. . . . . . . . . . . . . . . I 000A
TIMER2. . . . . . . . . . . . . . . I 000C
U_BOUND . . . . . . . . . . . . . . I 0096
VECT_IN . . . . . . . . . . . . . . I 00D4
VECT_IN_PTR . . . . . . . . . . . . I 00CA
VECT_OUT_PTR. . . . . . . . . . . . I 00CC
VECT_TO_XYZ . . . . . . . . . . . . L 4258
WATCHDOG. . . . . . . . . . . . . . I 000A
X_AVG . . . . . . . . . . . . . . . L BC4C
X_IN. . . . . . . . . . . . . . . . I 00E0
X_OUT . . . . . . . . . . . . . . . I 00BE
Y_AVG . . . . . . . . . . . . . . . L BC50
Y_IN. . . . . . . . . . . . . . . . I 00E2
Y_OUT . . . . . . . . . . . . . . . I 00C0
Z_AVG . . . . . . . . . . . . . . . L BC54
Z_IN. . . . . . . . . . . . . . . . I 00E4
Z_OUT . . . . . . . . . . . . . . . I 00C2

;ZZ

00 Errors (0000)
```

We claim:

1. An electronic device comprising a silicon element and a substrate for the element formed from a low dielectric, copper-exuding, boroaluminosilicate glass consisting essentially of, in percent by weight on the oxide basis, 56–64% $SiO_2$, 18–25% $B_2O_3$, 3–11% $Al_2O_3$, 0–2% CaO, 0–2% $Li_2O$, 0–1% $K_2O$, the total $Li_2O+K_2O+CaO$ being 1.5–3%, and 1–20% CuO, and having a coefficient of thermal expansion of $30-35 \times 10^{-7}$ at 300° C., a dielectric constant not over 5.0 at 100 KHz, and a loss tangent not over 0.003 at 100 KHz.

2. An electronic device in accordance with claim 1 wherein the substrate has a layer of exuded copper on a surface thereof.

3. An electronic device in accordance with claim 1 wherein the substrate has a pattern of exuded copper on a surface thereof.

4. An electronic device in accordance with claim 3 wherein the pattern of exuded copper is composed of fine lines forming electrical circuitry.

* * * * *

UNITED STATES PATENT AND TRADEMARK OFFICE
CERTIFICATE OF CORRECTION

PATENT NO. : 4,898,767

DATED : February 6, 1990

INVENTOR(S) : Gerald D. Fong and Sheryl L. Hultman

It is certified that error appears in the above-identified patent and that said Letters Patent is hereby corrected as shown below:

Delete all material through column 5 and 6, line 15, through column 101, line 55 and column 102, line 31.

Signed and Sealed this

Ninth Day of April, 1991

Attest:

HARRY F. MANBECK, JR.

*Attesting Officer*      *Commissioner of Patents and Trademarks*